United States Patent
Lee

(10) Patent No.: US 8,329,516 B2
(45) Date of Patent: Dec. 11, 2012

(54) METHODS OF MANUFACTURING SEMICONDUCTOR DEVICES

(75) Inventor: Moon-Sook Lee, Seoul (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 13/404,051

(22) Filed: Feb. 24, 2012

(65) Prior Publication Data

US 2012/0149156 A1 Jun. 14, 2012

Related U.S. Application Data

(62) Division of application No. 12/313,887, filed on Nov. 25, 2008, now Pat. No. 8,148,212.

(30) Foreign Application Priority Data

Nov. 28, 2007 (KR) .......................... 10-2007-0122148

(51) Int. Cl.
*H01L 21/44* (2006.01)
*H01L 21/336* (2006.01)

(52) U.S. Cl. . 438/142; 438/104; 438/652; 257/E21.575; 257/E21.645; 257/E21.665; 977/813; 977/842; 977/843; 977/890; 977/891

(58) Field of Classification Search .................. 438/104, 438/652, 142; 257/E21.575, E21.645, E21.665; 977/813, 842–843, 890–891

See application file for complete search history.

(56) References Cited

U.S. PATENT DOCUMENTS

| 2007/0017439 A1 | 1/2007 | Xianyu et al. |
| 2007/0238314 A1 | 10/2007 | Buretea et al. |
| 2008/0023693 A1* | 1/2008 | Dubrow et al. ................ 257/24 |
| 2010/0012180 A1* | 1/2010 | Day et al. ..................... 136/256 |

FOREIGN PATENT DOCUMENTS

| JP | 2004018342 | 1/2004 |
| KR | 1020030071915 | 9/2003 |
| KR | 1020060076861 | 7/2006 |
| KR | 1020070008023 | 1/2007 |
| WO | 2008047847 | 4/2008 |
| WO | WO 2008047847 A1 * | 4/2008 |

OTHER PUBLICATIONS

"Methods of Manufacturing Semiconductor Devices" Specification, Drawings,Claims and Prosecution History, of U.S. Appl. No. 12/313,887, filed Nov. 25, 2008, by Moon-Sook Lee, which is stored in the U.S. Patent and Trademark Office (USPTO).

* cited by examiner

*Primary Examiner* — Matthew Reames
*Assistant Examiner* — Ermias Woldegeorgis
(74) *Attorney, Agent, or Firm* — Onello & Mello LLP

(57) ABSTRACT

A plurality of nanowires is grown on a first substrate in a first direction perpendicular to the first substrate. An insulation layer covering the nanowires is formed on the first substrate to define a nanowire block including the nanowires and the insulation layer. The nanowire block is moved so that each of the nanowires is arranged in a second direction parallel to the first substrate. The insulation layer is partially removed to partially expose the nanowires. A gate line covering the exposed nanowires is formed. Impurities are implanted into portions of the nanowires adjacent to the gate line.

4 Claims, 24 Drawing Sheets

FIG. 1
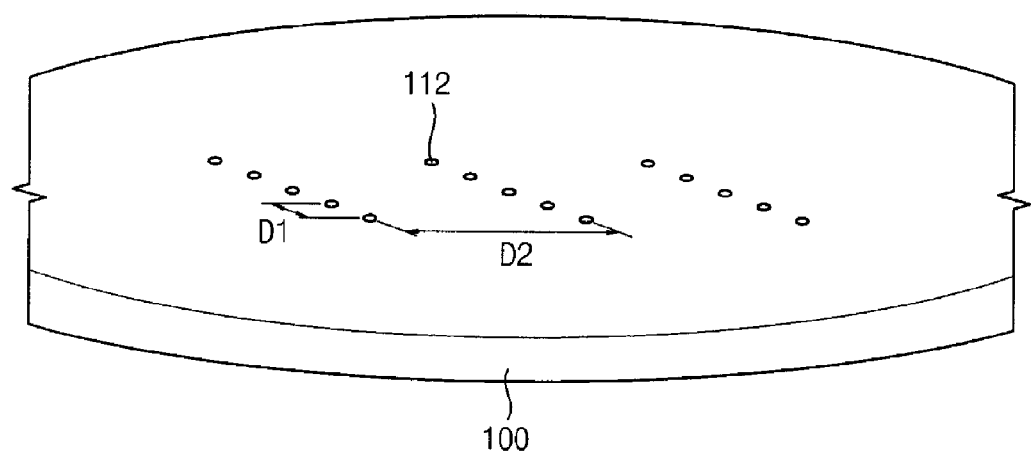
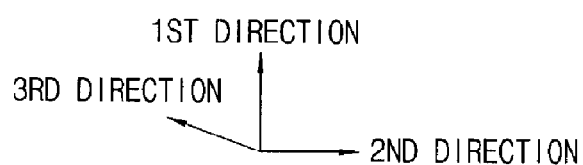
FIG. 2
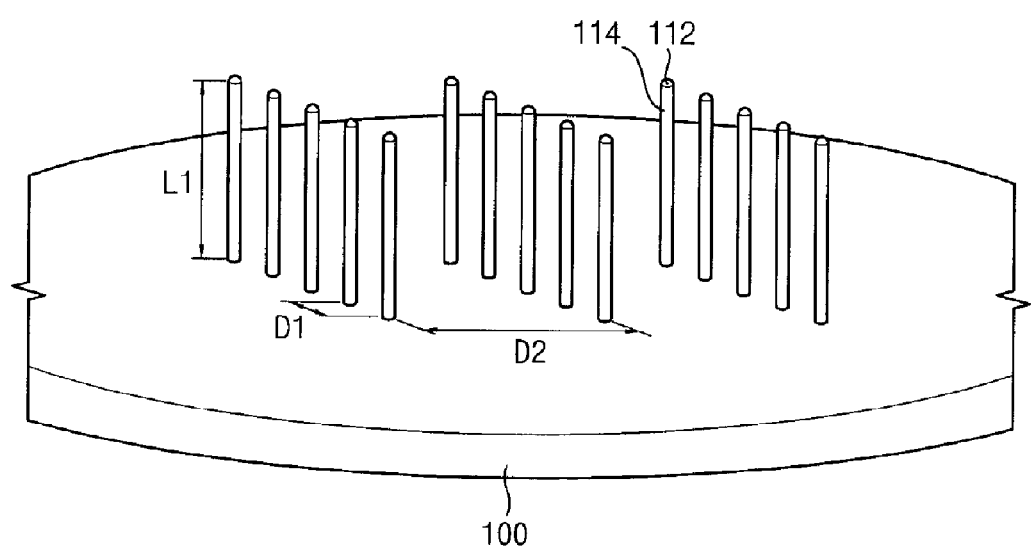

3RD DIRECTION
 ↑  2ND DIRECTION
 └→ 1ST DIRECTION

METHODS OF MANUFACTURING SEMICONDUCTOR DEVICES

CROSS-REFERENCE TO RELATED APPLICATION

This application is a divisional of U.S. Ser. No. 12/313,887, filed Nov. 25, 2008, and claims priority under 35 USC §119 to Korean Patent Application No. 2007-122148, filed on Nov. 28, 2007, in the Korean Intellectual Property Office (KIPO), the contents of which are herein incorporated by reference in their entirety.

FIELD OF THE INVENTION

Exemplary embodiments relate to methods of manufacturing semiconductor devices. More particularly, exemplary embodiments relate to methods of manufacturing semiconductor devices having nanowire channels.

BACKGROUND

For the purpose of realizing a high integration degree, semiconductor devices having nanowire channels have been developed. Methods of forming nanowires may be divided into a top-down method and a bottom-up method, and each method has its own advantages and disadvantages. For example, in the top-down method, forming a nanowire at a desired position can be easy, however, forming a nanowire smaller than a certain size may not be easy, so a high integration degree may not be realized. In order to overcome such disadvantages, a double-patterning method has been developed, however, performing the method can be complicated. A flow directed alignment method, a Langmuir Blodgett (LB) method, and a bubble-blown method are examples of the bottom-up method. In these methods, forming nanowires at desired positions in a desired arrangement may not be easy, even though forming nanowires having minute sizes can be easy.

SUMMARY

Exemplary embodiments provide a method of manufacturing a semiconductor device including a nanowire channel that is minute in size and well-arranged.

According to some exemplary embodiments, there is provided a method of manufacturing a semiconductor device. In the method, a plurality of nanowires is grown on a first substrate in a first direction perpendicular to the first substrate. An insulation layer covering the nanowires is formed on the first substrate to define a nanowire block including the nanowires and the insulation layer. The nanowire block is moved so that each of the nanowires is arranged in a second direction parallel to the first substrate. The insulation layer is partially removed to partially expose the nanowires. A gate line covering the exposed nanowires is formed. Impurities are implanted into portions of the nanowires adjacent to the gate line.

In exemplary embodiments, when the nanowires are grown, a nanowire column having a plurality of nanowires arranged at a first distance therebetween in a third direction perpendicular to the first direction may be formed.

In exemplary embodiments, when the nanowire column is formed, a nanowire array having a plurality of nanowire columns arranged at a second distance therebetween in a fourth direction perpendicular to the third direction may be formed.

In exemplary embodiments, when the nanowires are grown, the nanowires may be grown to a length less than the second distance.

In exemplary embodiments, when the nanowire block is defined, a portion of the insulation layer having a first width in the third direction may be removed to form a plurality of nanowire blocks, each of which includes one nanowire column and an insulation layer pattern.

In exemplary embodiments, when the portion of the insulation layer is removed, the portion of the insulation layer may be removed so that a surface of each nanowire may be exposed.

In exemplary embodiments, after the nanowires are grown, a tunnel insulation layer, a charge storing layer and a blocking layer enclosing the nanowires may be sequentially formed.

In exemplary embodiments, after the nanowire block is defined, both end portions of each nanowire may be removed.

In exemplary embodiments, when the insulation layer is partially removed, an opening having a second width in a fifth direction perpendicular to the second direction may be formed.

In exemplary embodiments, a trench may be formed on the first substrate to be in fluid communication with the opening.

In exemplary embodiment, when the nanowire block is moved, the nanowire block may be moved onto a second substrate, so that each of the nanowires may extend in a sixth direction parallel to the second substrate.

In exemplary embodiments, a common source line (CSL), a bit line plug and a bit line may be further formed. The CSL and the bit line plug may make contact with the nanowires, and the bit line may make contact with the bit line plug. Each nanowire, a plurality of gate lines corresponding to each nanowire, the CSL, the bit line plug and the bit line may define a string. Each nanowire may have a length corresponding to integer times of a length of the string.

According to other exemplary embodiments, there is provided a method of manufacturing a semiconductor device. In the method, a plurality of first nanowires is grown on a first substrate in a first direction perpendicular to the first substrate. A first insulation layer covering the first nanowires is formed to define a nanowire block including the first nanowires and the first insulation layer. The first nanowire block is moved so that each of the nanowires is arranged in a second direction parallel to the first substrate. A second nanowire block including second nanowires, each of which extends in a third direction parallel to the first substrate, and a second insulation layer is disposed on the first nanowire block. The first and second insulation layers are removed using the second nanowires as an etching mask. A gate line covering portions of the first nanowires exposed by the second nanowires is formed. Impurities are implanted into portions of the first nanowires adjacent to the gate line.

In exemplary embodiments, when the first and second insulation layers are removed, a dry etching process using the second nanowires as the etching mask may be performed.

In exemplary embodiments, before impurities are implanted into the portions of the first nanowires, the second nanowires may be removed.

In exemplary embodiments, when the first nanowire block is moved, the first nanowire block may be moved onto a second substrate, so that each of the first nanowires may extend in a fourth direction parallel to the second substrate.

According to still other exemplary embodiments, there is provided a method of manufacturing a semiconductor device. In the method, a plurality of nanowires is grown on a first substrate. A second substrate is moved above the first substrate to attach the nanowires on the first substrate onto a face of the second substrate, so that each of the nanowires is arranged in a first direction parallel to the second substrate. A first insulation layer covering the nanowires is formed to define a nanowire block including the nanowires and the first insulation layer. The first insulation layer is partially removed to partially expose the nanowires. A gate line covering the exposed nanowires is formed. Impurities are implanted into portions of the nanowires adjacent to the gate line.

In exemplary embodiments, a material having a viscosity may be coated on the second substrate so that the nanowires may be attached to the face of the second substrate.

In exemplary embodiments, a second insulation layer having an opening, which defines an area for forming the nanowire block, may be formed on the face of the second substrate.

In exemplary embodiments, after the nanowire block is formed, the second insulation layer may be removed.

In exemplary embodiments, when the nanowires are grown on the first substrate, a plurality of catalyst particles may be coated on the first substrate in a second direction perpendicular to the first direction, and the nanowires may be grown by a chemical vapor deposition (CVD) process.

In exemplary embodiment, the nanowires attached to the second substrate may be disposed at a given distance therebetween in a second direction perpendicular to the first direction to form a nanowire column.

In exemplary embodiments, a plurality of nanowire columns may be disposed at a given distance therebetween in the first direction to form a nanowire array.

In exemplary embodiments, when the nanowire block is defined, a portion of the first insulation layer having a given width in the second direction may be removed to form a plurality of nanowire blocks, each of which includes one nanowire column and an insulation layer pattern.

In exemplary embodiments, after the nanowire block is defined, both end portions of each nanowire may be removed.

According to some exemplary embodiments, a semiconductor device including a nanowire channel having a minute size may be easily manufactured. For example, a nanowire channel having a minute size and being well-arranged may be formed by a hybrid method including a top-down method and a bottom-up method, so that a highly integrated semiconductor device may be manufactured.

BRIEF DESCRIPTION OF THE DRAWINGS

Exemplary embodiments will be more clearly understood from the following detailed description taken in conjunction with the accompanying drawings. FIGS. 1 to 36 represent non-limiting, exemplary embodiments as described herein.

FIGS. 1 to 3, FIGS. 5 to 11, and FIG. 16 are perspective views illustrating a method of manufacturing a semiconductor device in accordance with some exemplary embodiments;

FIG. 4 is an enlarged perspective view of an area A in FIG. 3;

FIGS. 12 and 13 are cross-sectional views taken along lines I-I' and respectively, in FIG. 11;

FIGS. 14 and 15 are cross-sectional views illustrating gate lines in accordance with an exemplary embodiment, and particularly FIGS. 14 and 15 are cross-sectional views taken along lines I-I' and respectively, in FIG. 11;

FIGS. 17 and 18 are cross-sectional views illustrating a method of manufacturing a flash memory device in accordance with some exemplary embodiments, and particularly FIGS. 17 and 18 are cross-sectional views taken along line in FIG. 16;

FIGS. 19 to 22 are perspective views illustrating a method of manufacturing a semiconductor device in accordance with some exemplary embodiments;

FIG. 23 is a cross-sectional view illustrating a method of manufacturing a flash memory device in accordance with some exemplary embodiments;

FIGS. 24, 25, and 27 to 30 are perspective views illustrating a method of manufacturing a semiconductor device in accordance with some exemplary embodiments;

FIG. 26 is an enlarged perspective view of an area B in FIG. 25; and

FIGS. 31 to 36 are perspective views illustrating a method of manufacturing a semiconductor device in accordance with some exemplary embodiments.

DETAILED DESCRIPTION OF THE EMBODIMENTS

Figure 3:
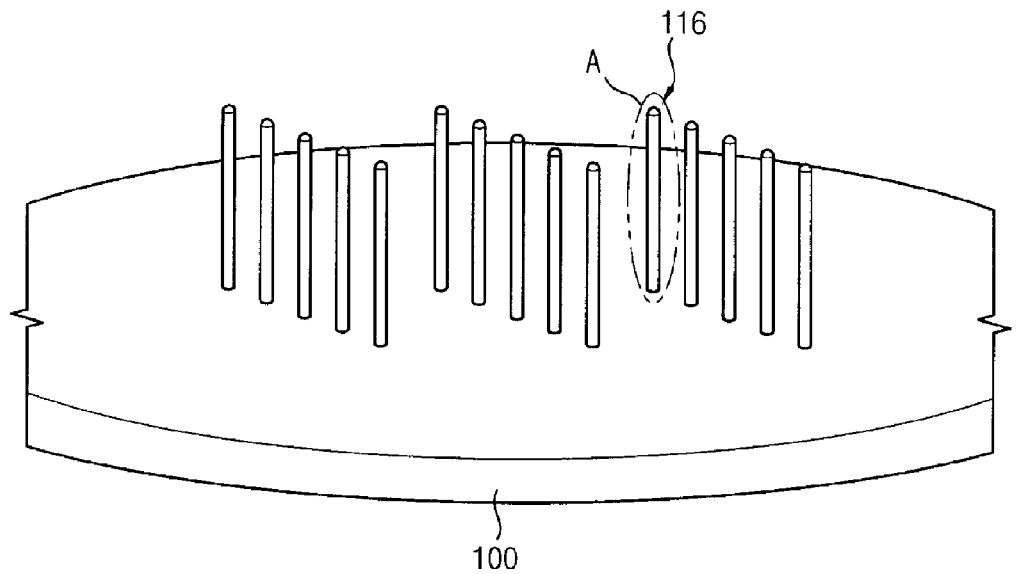

Various exemplary embodiments will be described more fully hereinafter with reference to the accompanying drawings, in which some exemplary embodiments are shown. The present invention may, however, be embodied in many different forms and should not be construed as limited to the exemplary embodiments set forth herein. Rather, these exemplary embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms "first", "second", "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

The terminology used herein is for the purpose of describing particular exemplary embodiments only and is not intended to be limiting of the present invention. As used herein, the singular forms "a," "an" and "the" are intended to include the plural forms as well, unless the context clearly indicates otherwise. It will be further understood that the terms "comprises" and "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments will be explained in detail with reference to the accompanying drawings.

FIGS. 1 to 3, FIGS. 5 to 11, and FIG. 16 are perspective views illustrating a method of manufacturing a semiconductor device in accordance with some exemplary embodiments.

Referring to FIG. 1, a plurality of catalyst particles 112 is applied onto a first substrate 100.

The first substrate 100 may include an insulating material. For example, the first substrate 100 may include an oxide such as silicon oxide, a nitride such as silicon nitride, etc.

Each of the catalyst particles 112 has a diameter of about several nanometers, and may include a metal. For example, the catalyst particles 112 may include gold, nickel, cobalt, aluminum, etc.

The catalyst particles 112 may be applied onto the first substrate 100 by an imprint method, a lift-off method or a photo-etch method.

The catalyst particles 112 are applied onto the first substrate 100 at a first distance D1 therebetween in a third direction parallel to the first substrate 100, and may form a catalyst particle column. The first distance D1 may correspond to a distance between strings, which will be formed later. In some exemplary embodiments, a plurality of the catalyst particle columns is formed at a second distance D2 therebetween in a second direction perpendicular to the third direction, and may form a catalyst particle array.

Referring to FIG. 2, a chemical vapor deposition (CVD) process using a nanowire source gas is performed to grow a plurality of nanowires 114 at positions where the catalyst particles 112 are formed. The catalyst particles 112 may remain on the nanowires 114. The nanowires 114 may grow to a first length L1 in a first direction perpendicular to the first substrate 100. If a process for removing end portions of a nanowire block, which will be described later, is not performed, the first length L1 may have a value corresponding to integer times of a length of the string. In some exemplary embodiments, the first length L1 is less than the second distance D2. As the nanowires 114 grow, a nanowire column and a nanowire array, which correspond to the catalyst particle column and the catalyst particle array, respectively, may be formed on the first substrate 100.

A silicon source gas, such as silane ($SiH_4$), tetrachlorosilane ($SiCl_4$), etc. or a germanium source gas, such as germane ($GeH_4$), germanium tetrachloride ($GeCl_4$), etc., may be used as the nanowire source gas. Accordingly, nanowires 114 may grow to be semiconductor nanowires including silicon or germanium. In some exemplary embodiments, when the nanowires 114 are grown, a p-type impurity source gas (such as diborane ($B_2H_6$)) or an n-type source gas (such as phosphine ($PH_3$)) may be further used, so that a semiconductor nanowire doped with p-type impurities or n-type impurities may be formed.

Figure 4:
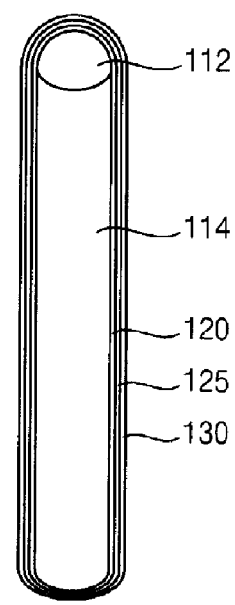

FIG. 4 is an enlarged perspective view of an area A in FIG. 3.

Referring to FIGS. 3 and 4, a tunnel insulation layer 120, a charge storing layer 125 and a blocking layer 130 are sequentially formed on each of the nanowires 114 and each of the catalyst particles 112. Thus, a plurality of nanowire structures 116, each of which includes the nanowire 114, the catalyst particle 112, the tunnel insulation layer 120, the charge storing layer 125 and the blocking layer 130, is formed on the first substrate 100. The tunnel insulation layer 120, the charge storing layer 125 and the blocking layer 130 may be formed by a CVD process or an atomic layer deposition (ALD) process.

Figure 17:
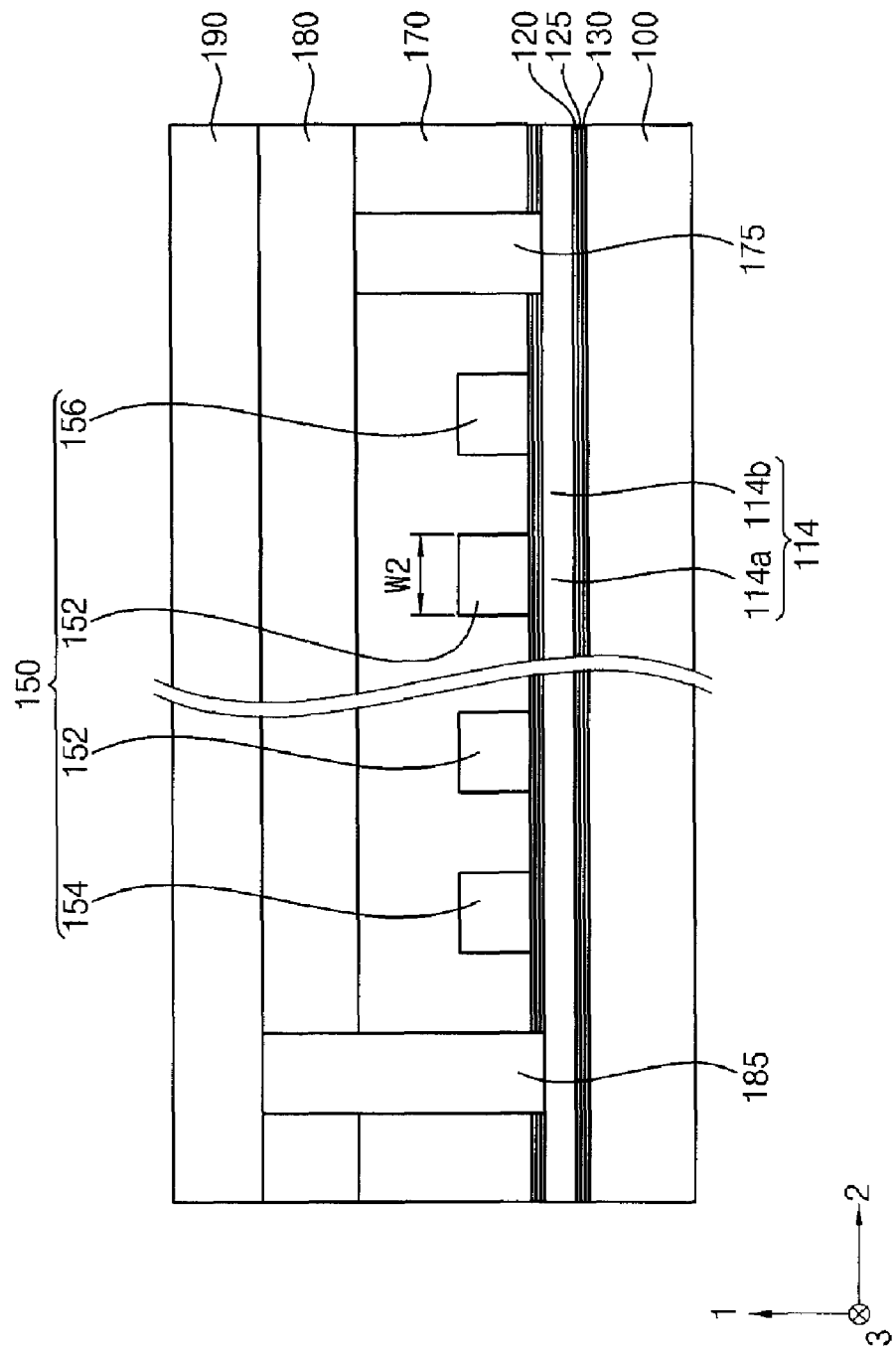
Figure 18:
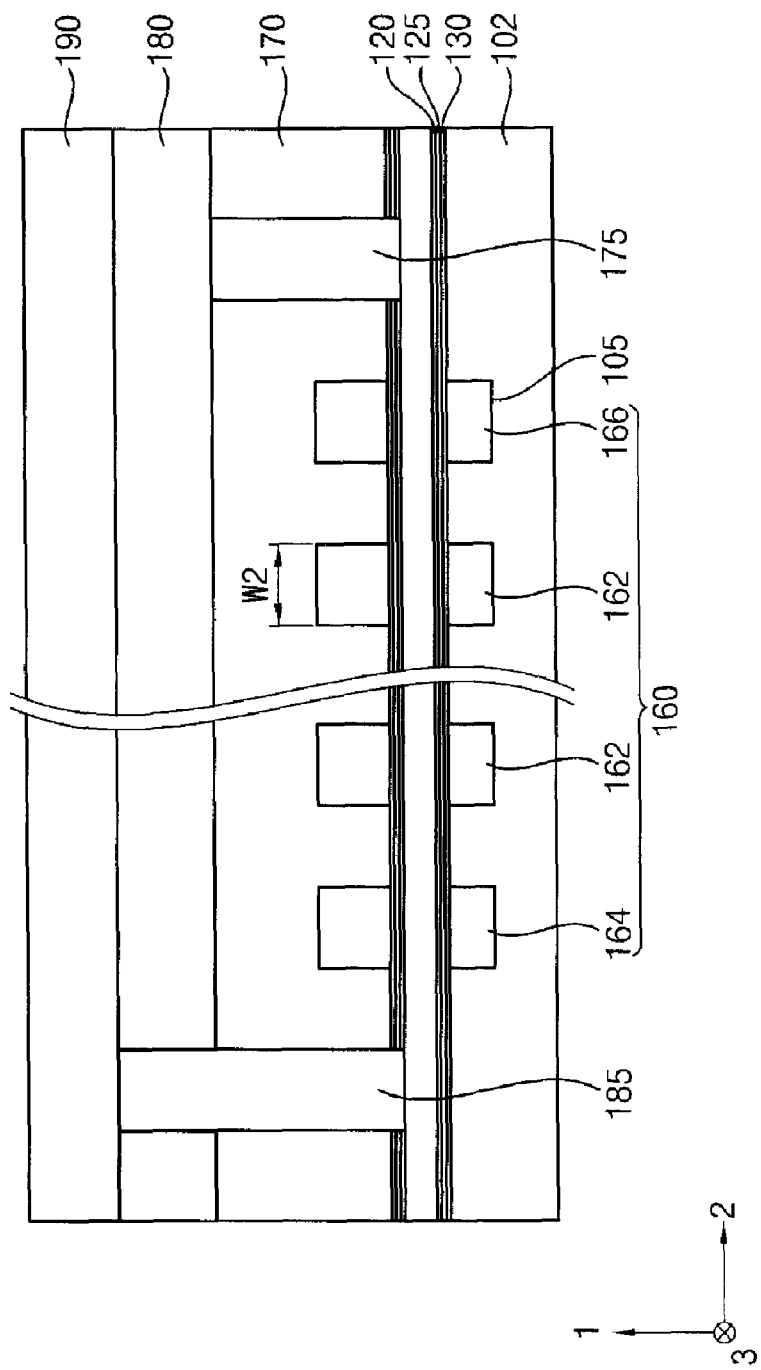
Figure 23:
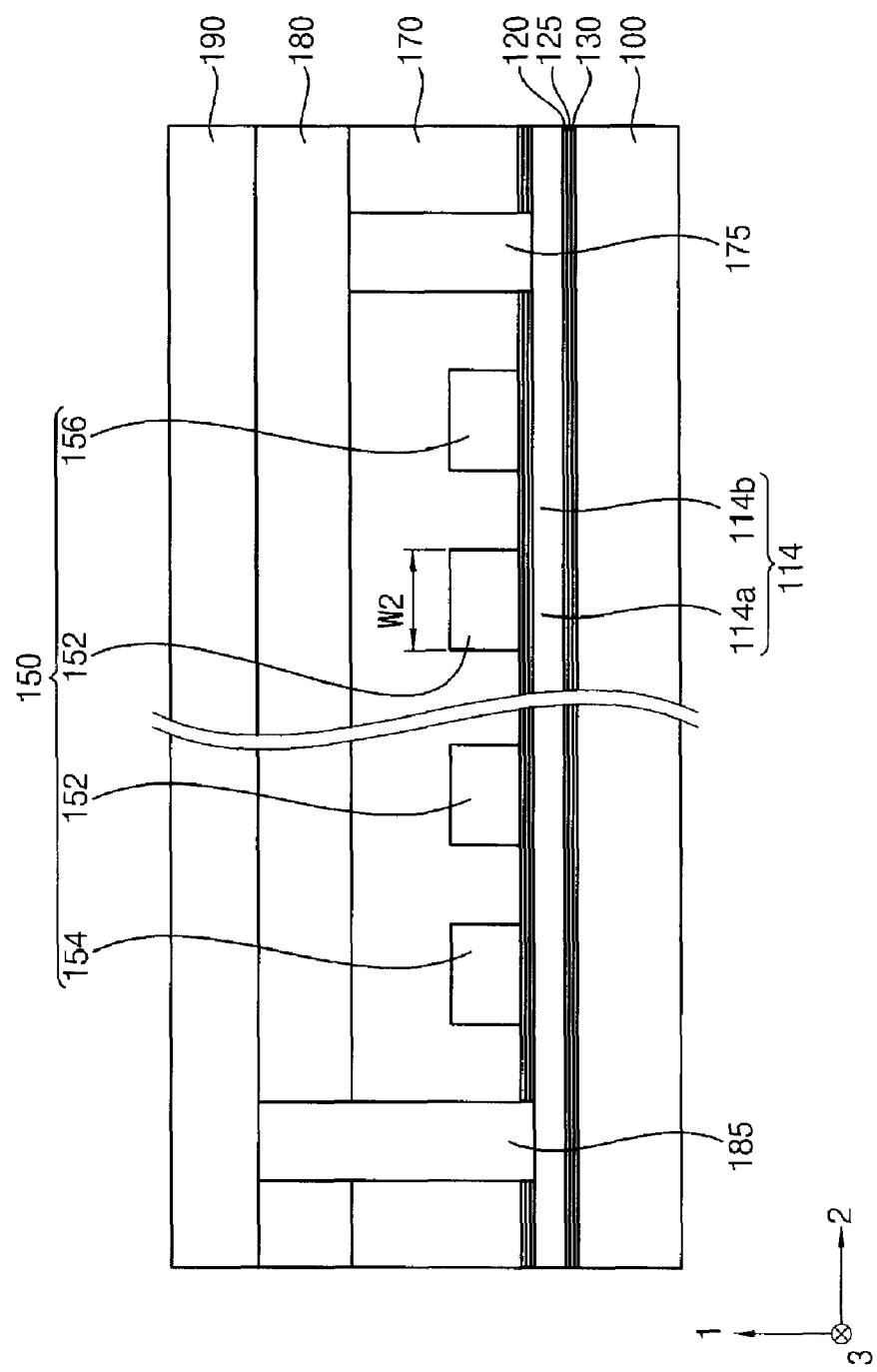

In FIG. 3, the tunnel insulation layer 120, the charge storing layer 125 and the blocking layer 130 are not shown in order to avoid complicating the drawings, and in the same manner, other drawings do not show the above layers, except for FIGS. 17, 18 and 23.

The tunnel insulation layer 120 is formed to insulate each of the nanowires 114 from the charge storing layer 125. The tunnel insulation layer 120 may be formed using silicon oxide, silicon nitride or a metal oxide having a high dielectric constant. For example, the tunnel insulation layer 120 may be formed using silicon oxide, silicon nitride, hafnium oxide, zirconium oxide, aluminum oxide, hafnium silicon oxide, zirconium silicon oxide, hafnium aluminum oxide, lanthanum aluminum oxide, etc.

The charge storing layer 125 may store charges that have moved from a channel region in each of the nanowires 114. The charge storing layer 125 may be formed using a nitride such as silicon nitride, a hafnium oxide such as hafnium silicon oxide, polysilicon, etc.

The blocking layer 130 may insulate gate lines 150 (see FIG. 11), which will be formed later, from the charge storing layer 125. The blocking layer 130 may be formed using a metal oxide or a silicon oxide. Alternatively, the blocking layer 130 may be formed to have a multi-layered structure in which a silicon oxide layer, a silicon nitride layer, and a silicon oxide layer are sequentially stacked.

Figure 5:
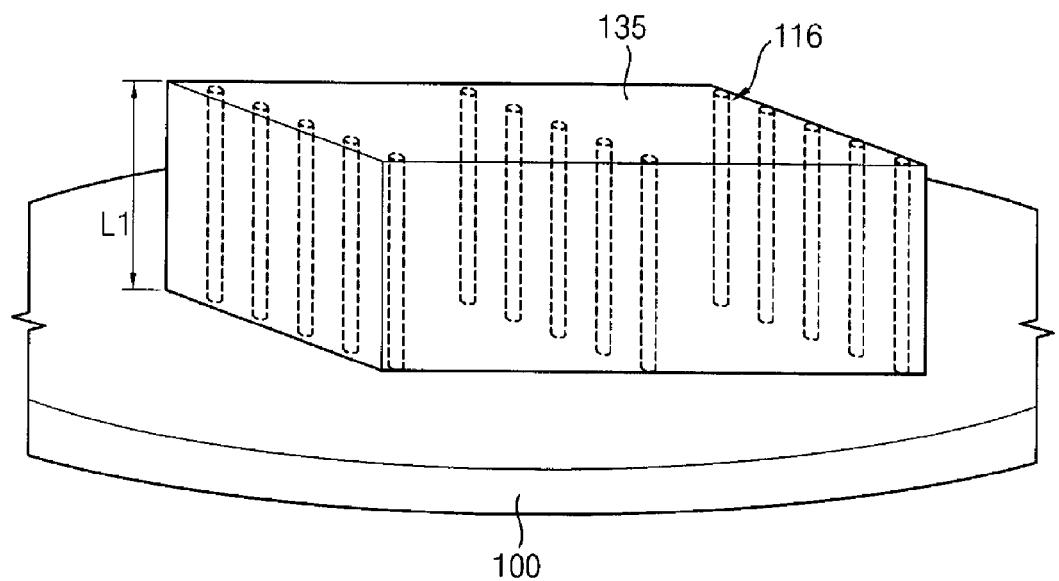

Referring to FIG. 5, an insulation layer 135 is formed on the first substrate 100 to cover the nanowire structures 116.

Thus, a nanowire block having the nanowire structures 116 and the insulation layer 135 is formed. In some exemplary embodiments, the insulation layer 135 is formed to cover one nanowire structure column including a plurality of nanowire structures 116 formed in the third direction. In other exemplary embodiments, the insulation layer 135 is formed to cover a nanowire structure array including a plurality of nanowire structure columns formed in the second direction. Hereinafter, only the case in which the insulation layer 135 covers the nanowire structure array will be described for convenience.

The insulation layer 135 may be formed by depositing an insulating material having an etching selectivity with respect to silicon oxide, and planarizing the deposited insulating material. For example, the insulation layer 135 may be formed using an insulating material such as silicon carbide ($SiC_x$) or an organo-silicon material. The insulation layer 135 may have a height substantially the same as the first length L1 corresponding to the length of the nanowire structure 116.

Figure 6:
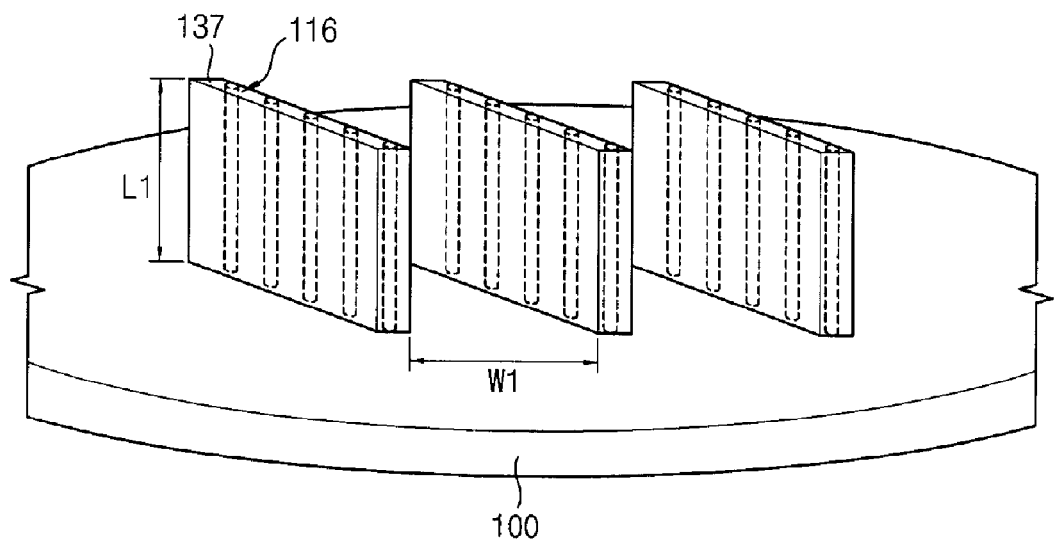

Referring to FIG. 6, the insulation layer 135 is partially removed to form a plurality of insulation layer patterns 137 distant from each other at a first width W1. Thus, a plurality of nanowire blocks each of which includes one insulation layer pattern 137 and one nanowire structure column may be formed. In particular, portions of the insulation layer 135, each of which extends in the third direction and has the first width W1 in the second direction may be removed by a photolithography process, so that a plurality of insulation layer patterns 137 may be formed. In exemplary embodiments, the insulation layer patterns 137 may be formed by performing a directional dry etching process until one surface of each nanowire structure 116 is exposed. Each nanowire block may include the nanowire structures 116 belonging to the nanowire structure column, and the insulation layer pattern 137 exposing one surface of each nanowire structure 116 and covering the other surface of each nanowire structure 116. Alternatively, each of the insulation layer patterns 137 may be formed to completely cover the surfaces of the nanowire structures 116.

Figure 7:
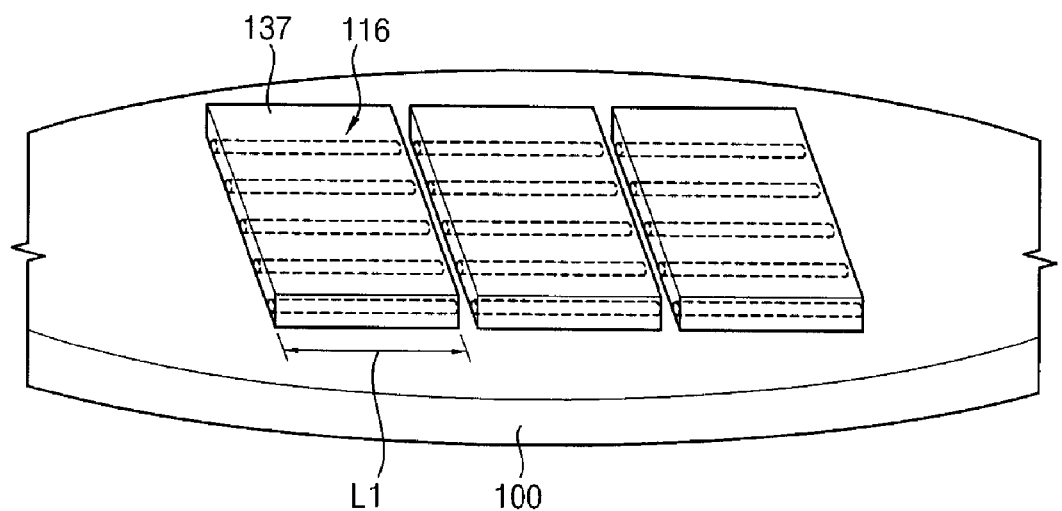

Referring to FIG. 7, the nanowire blocks are moved so that the nanowire structures 116 are arranged in a direction parallel to the first substrate 100. In exemplary embodiments, each nanowire block is rotated 90 degrees so that each of the nanowire structures 116 may be arranged in the second direction. The exposed surfaces of the nanowire structures 116 may contact the first substrate 100. The first width W1 is larger than the first length L1, and thus the orientation may be performed easily. Hereinafter, the case in which each of the nanowire structures 116 is arranged in the second direction will be described.

Figure 8:
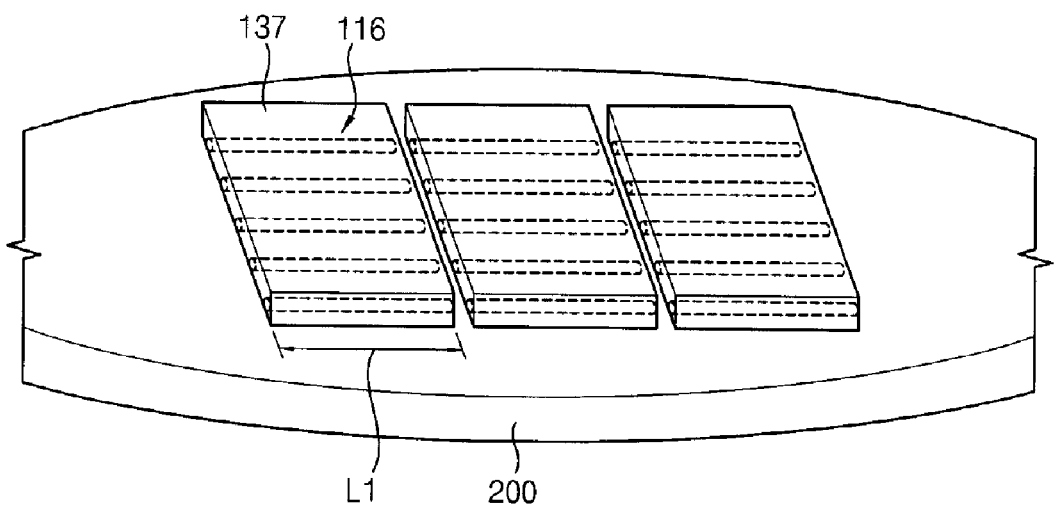

As shown in FIG. 8, the nanowire blocks may be moved onto a second substrate 200 different from the first substrate 100. That is, the nanowire blocks may be moved onto the second substrate 200, so that each of the nanowire structures 116 may be arranged in a direction parallel to the second substrate 200. In this case, the nanowire blocks are moved onto the second substrate 200 on which the nanowires 114 are not originally grown. Thus, after growing the nanowires 114 on one substrate where the nanowires 114 may be easily grown, a process for manufacturing a semiconductor device may be performed on another substrate where the semiconductor device may be easily manufactured.

Figure 9:
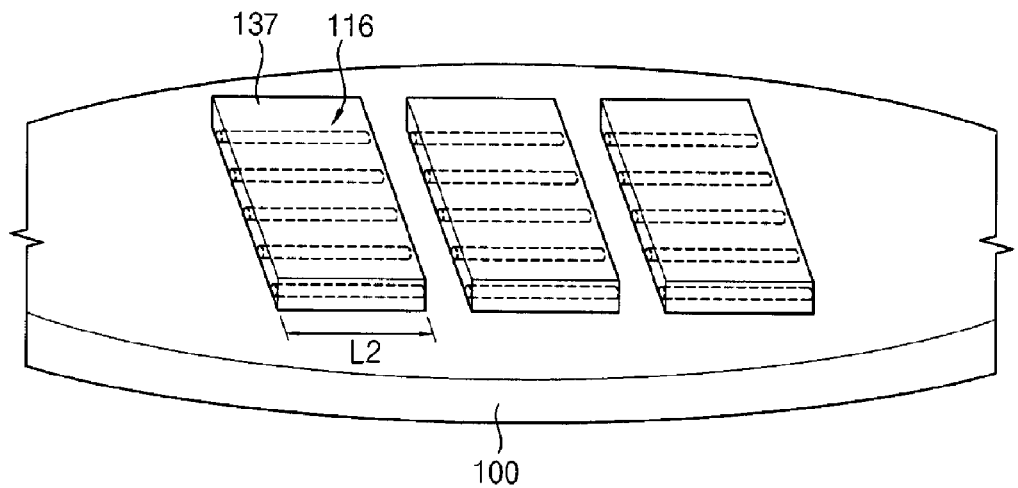

Referring to FIG. 9, both end portions of each nanowire block are removed. In particularly, both end portions of each nanowire block in the second direction are removed, so that the catalyst particles 112 of the nanowire structures 116 may be removed. That is, the catalyst particles 112 lowering the uniformity of the electrical characteristics of the nanowires 114 are removed, and lengths of the nanowires 114 that are overgrown are controlled. Thus, each of the nanowire blocks may have a second length L2 in the second direction. The second length L2 may be integer times of the string length. Alternatively, only one end portion of each nanowire block adjacent to each catalyst particle 112 may be removed. Alternatively, the process for removing the end portions of the nanowire blocks may not be performed. In this case, the first length L1 may have a value corresponding to integer times of the string length. Even though the process for removing the end portions of the nanowire blocks is performed, the sizes of the catalyst particles 112 are much smaller than the lengths of the nanowires 114, and thus the first length L1 is very similar to the second length L2.

Hereinafter, only one nanowire block will be described for convenience.

Figure 10:
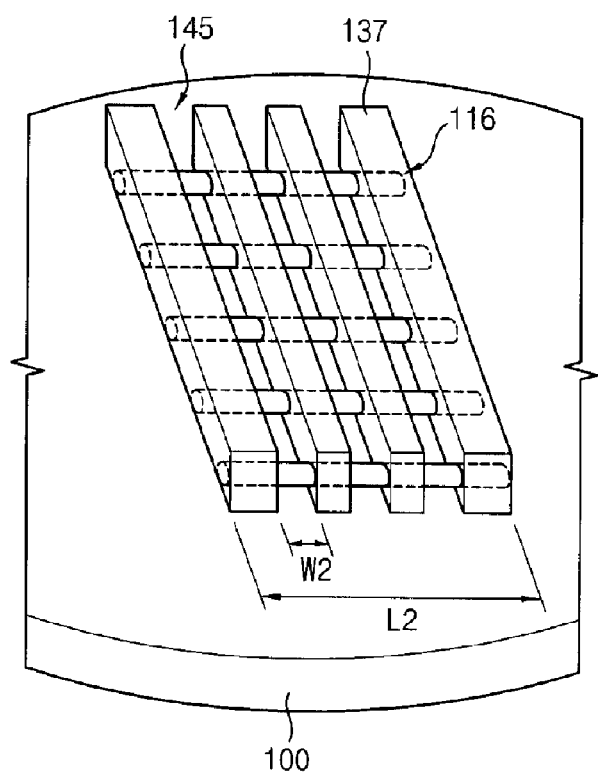

Referring to FIG. 10, the insulation layer pattern 137 is partially removed by a photolithography process using a photoresist pattern (not shown) to form an opening 145 partially exposing the nanowire structures 116. In exemplary embodiments, a plurality of openings 145, each of which extends in the third direction and has a second width W2 in the second direction, is formed. The insulation layer pattern 137 has an etching selectivity with respect to the blocking layer 130, which is formed at a peripheral portion of each nanowire structure 116, so that the blocking layer 130 may not be damaged during the photolithography process. Additionally, portions of the insulation layer pattern 137 under the nanowire structures 116 may be easily removed even though each nanowire structure 116 has a cylindrical shape.

Figure 11:
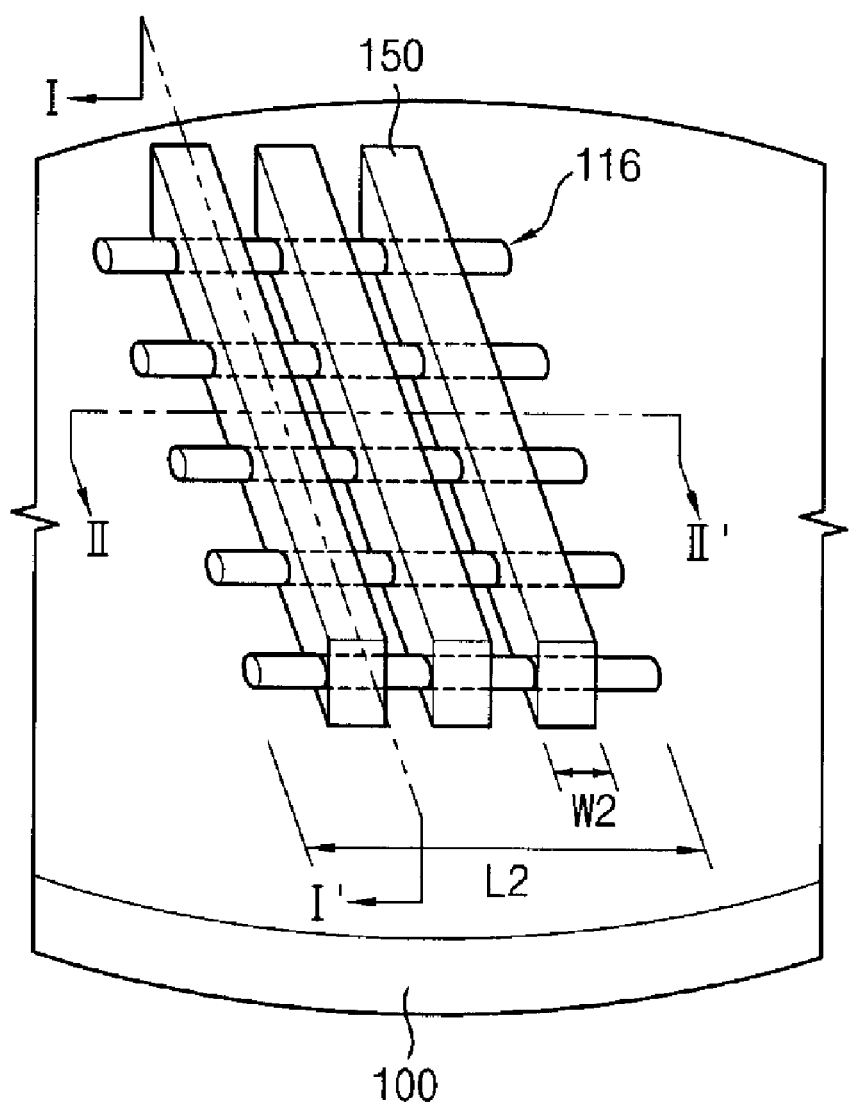

Referring to FIG. 11, a conductive layer filling up the opening 145 is formed on the first substrate 100. The conductive layer may be formed using polysilicon, a metal or a metal silicide. An upper portion of the conductive layer is planarized to form a gate line 150.

In exemplary embodiments, a plurality of gate lines 150, each of which extends in the third direction and fills up the openings 145, is formed. The insulation layer pattern 137 is removed.

Figure 12:
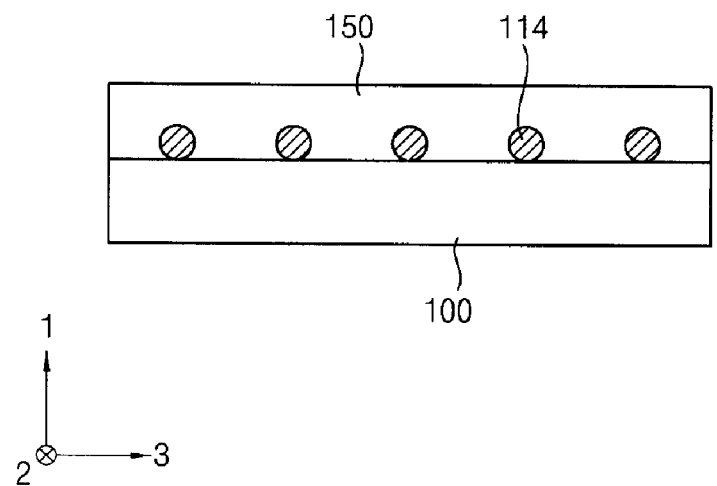
Figure 13:
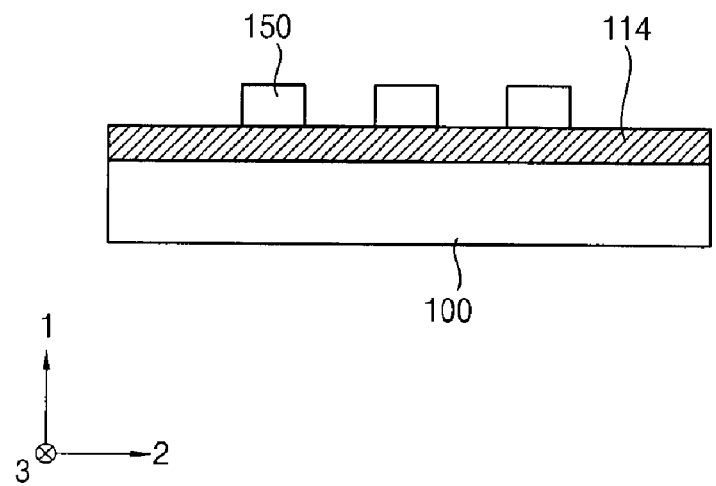

FIGS. 12 and 13 are cross-sectional views taken along lines I-I' and respectively, in FIG. 11.

Referring to FIGS. 12 and 13, the nanowire structures 116, each of which extends in the second direction, are formed on the first substrate 100, and the gate lines 150, each of which extends in the third direction and encloses a portion of the nanowire structures 116 in an n-shape, are formed on the first substrate 100.

Figure 14:
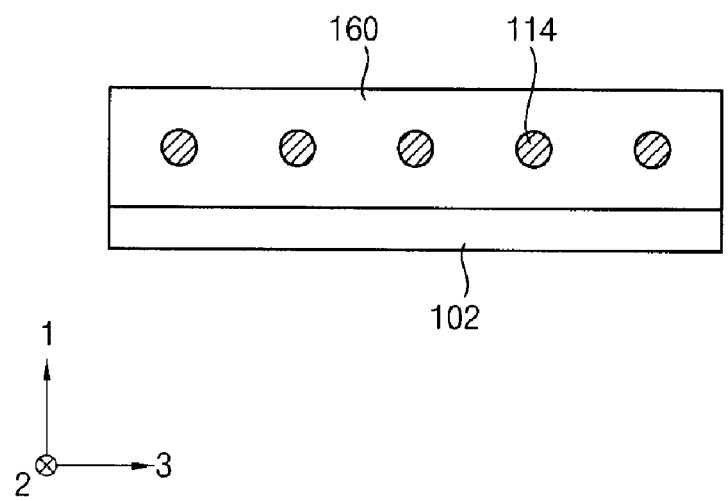
Figure 15:
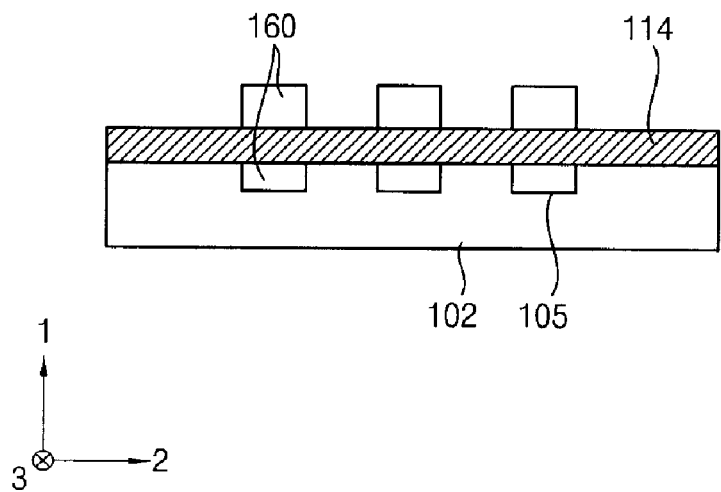

FIGS. 14 and 15 are cross-sectional views illustrating gate lines 160 in accordance with other exemplary embodiments. FIGS. 14 and 15 are cross-sectional views taken along lines I-I' and II-II', respectively, in FIG. 11.

Referring to FIGS. 14 and 15, a plurality of trenches 105, each of which extends in the third direction, is formed on a third substrate 102 in the second direction. The trenches 105 are filled with the gate lines 160, and the nanowire structures 116 are enclosed by the gate lines 160. Thus, a gate-all-around (GAA) type semiconductor device may be manufactured.

The GAA type semiconductor device shown in FIGS. 14 and 15 may be formed by following methods.

The nanowire block is positioned on the third substrate 102 having the trenches 105, each of which extends in the third direction and has the second width W2 in the second direction. Each nanowire structure 116 included in the nanowire block is arranged in the second direction. The insulation layer 135 is partially removed to form the insulation layer pattern 137 having the openings 145, each of which extends in the third direction and has the second width W2 in the second direction. Each of the openings 145 may be formed to be in fluid communication with each of the trenches 105. A conductive layer that fills the openings 145 and the trenches 105 is formed on the third substrate 102 and planarized to form the gate lines 160 enclosing portions of the nanowire structures 116. The insulation layer pattern 137 is removed.

Figure 16:
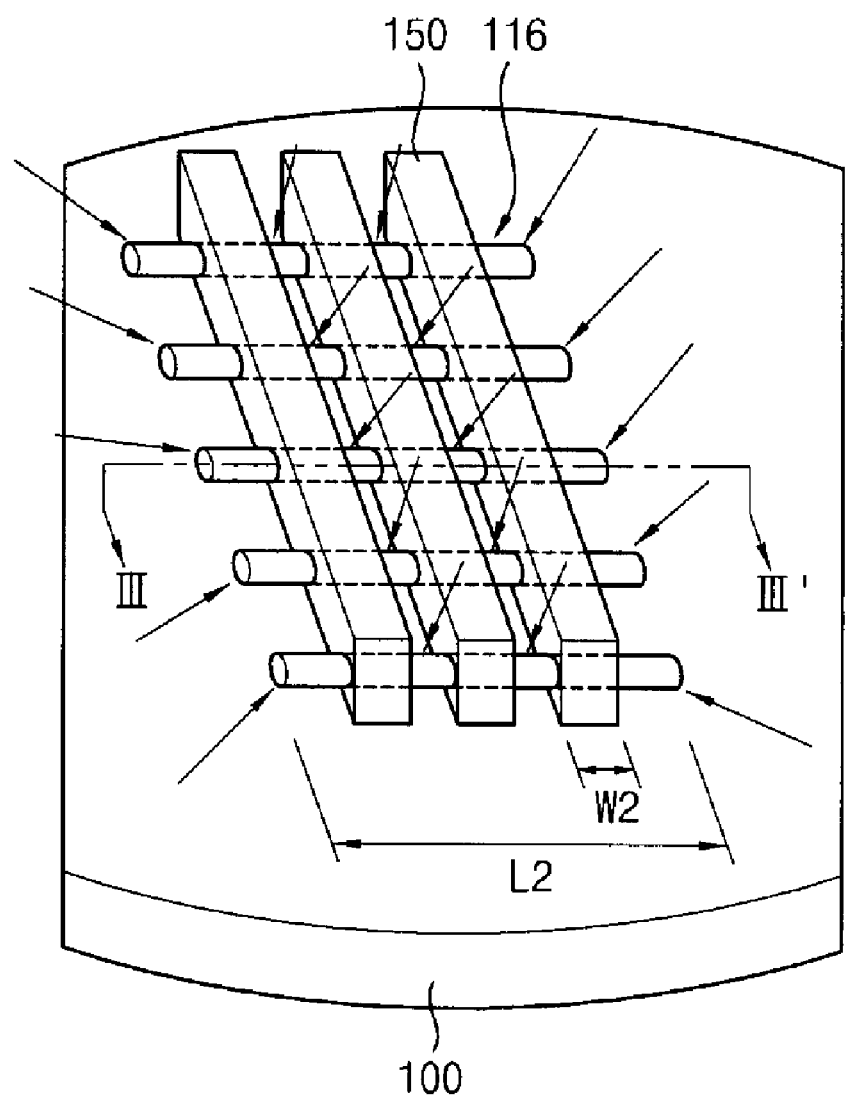

Referring to FIG. 16, impurities are implanted into the nanowire structures 116 exposed by the gate lines 150. Thus, an impurity region 114b (see FIG. 17) doped with the impurities and a channel region 114a (see FIG. 17) covered by the gate lines 150 may be formed in each of the nanowires 114.

When the nanowires 114 include silicon or germanium doped with p-type impurities, the implantation process may be performed using a Group III element such as boron, and when the nanowires 114 includes silicon or germanium doped with n-type impurities, the implantation process may be performed using a Group V element such as phosphorus.

Therefore, a semiconductor device having a Ω-type gate line or a GAA type semiconductor device may be manufactured.

A flash memory device including a nanowire channel may be manufactured by the following processes. For convenience, the processes are described with reference to FIGS. 17 and 18, which are cross-sectional views taken along the line III-III' in FIG. 16.

Referring to FIG. 17, a first insulating interlayer 170 is formed on the first substrate 100 to cover the gate lines 150 and the nanowire structures 116. The first insulating interlayer 170 may be formed using an oxide such as silicon oxide by a CVD process or an ALD process.

The gate lines 150 include a plurality of word lines 152, a string selection line (SSL) 154 and a ground selection line (GSL) 156. In exemplary embodiments, 32 word lines 152 are formed between the SSL 154 and the GSL 156.

Additionally, the nanowire 114 in the nanowire structure 116 includes the channel region 114a and the impurity region 114b.

The first insulating interlayer 170, the blocking layer 130, the charge storing layer 125 and the tunnel insulation layer 120 are partially removed to form a first hole extending in the third direction, and a first conductive layer is formed to fill the first hole. The first conductive layer may be formed using polysilicon, a metal or a metal silicide. An upper portion of the first conductive layer is planarized to form a common source line (CSL) 175 that contacts the impurity region 114b of the nanowire 114.

A second insulating interlayer 180 is formed on the first insulating interlayer 170 and the CSL 175. The second insulating interlayer 180 may be formed using an oxide such as silicon oxide by a CVD process or an ALD process.

The second insulating interlayer 180, the first insulating interlayer 170, the blocking layer 130, the charge storing layer 125 and the tunnel insulation layer 120 are partially removed to form a second hole, and a second conductive layer is formed to fill the second hole. The second conductive layer may be formed using polysilicon, a metal or a metal silicide. An upper portion of the second conductive layer is planarized to form a bit line plug 185 that contacts the impurity region 114b of the nanowire 114.

A third conductive layer is formed on the second insulating interlayer 180. The third conductive layer may be formed using polysilicon, a metal or a metal silicide. The third conductive layer is patterned to form a bit line 190 electrically connected to the bit line plug 185 and extending in the second direction.

Alternatively, the bit line plug 185 and the bit line 190 may be formed simultaneously by depositing and patterning the same conductive material.

Accordingly, the flash memory device may be manufactured.

A flash memory device in FIG. 18 is substantially the same as that of FIG. 17, except that the trenches 105 are formed on the third substrate 102 and the gate lines 160 completely enclose a portion of the nanowire structure 116. Like numerals refer to like elements, and repetitive explanations are omitted here. The gate lines 160 include a plurality of word lines 162, an SSL 164 and a GSL 166.

FIGS. 19 to 22 are perspective views illustrating a method of manufacturing a semiconductor device in accordance with other exemplary embodiments.

Figure 19:
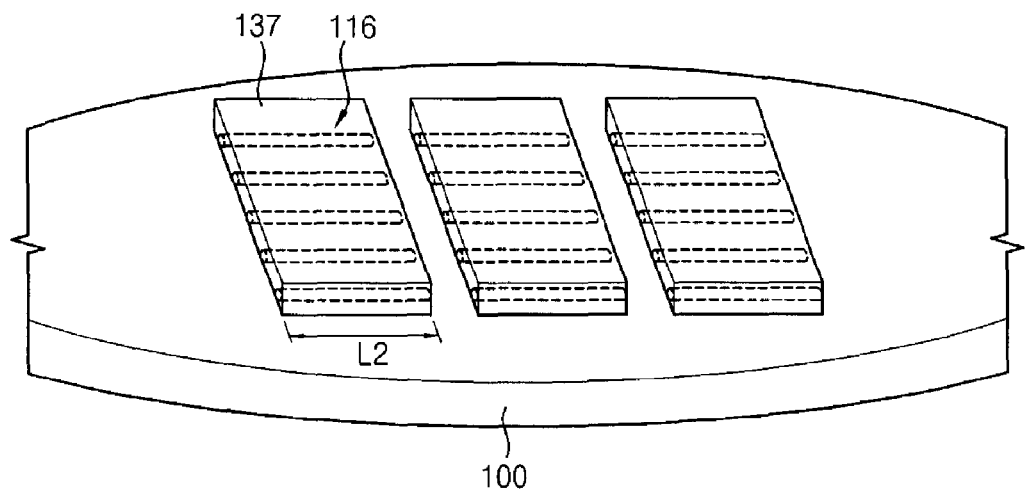

Referring to FIG. 19, the nanowire block in FIG. 9 (hereinafter, referred to as a first nanowire block) is formed on the first substrate 100 by the above processes illustrated with reference to FIGS. 1 to 8. Like numerals refer to like elements, and repetitive explanations are omitted here.

Figure 20:
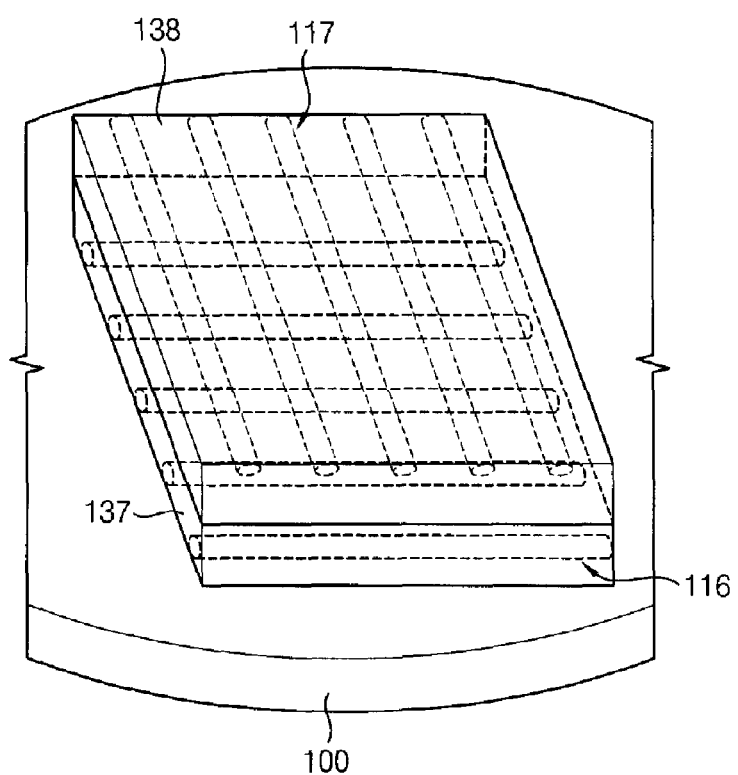

Referring to FIG. 20, a second nanowire block is disposed on the first nanowire block. The second nanowire block includes a plurality of nanowire structures 117 and a second insulation layer pattern 138.

The second nanowire block may be disposed so that each of second nanowire structures 117 extends in the third direction perpendicular to the second direction. In exemplary embodiments, the second nanowire block is disposed so that one surface of each second nanowire structure 117 is exposed. In other exemplary embodiments, the second nanowire block may be disposed so that one surface of each second nanowire structure 117 makes contact with the first nanowire block. In still other exemplary embodiments, the second nanowire block may be disposed so that the second insulation layer pattern 138 may encloses all surfaces of the second nanowire structures 117.

Figure 21:
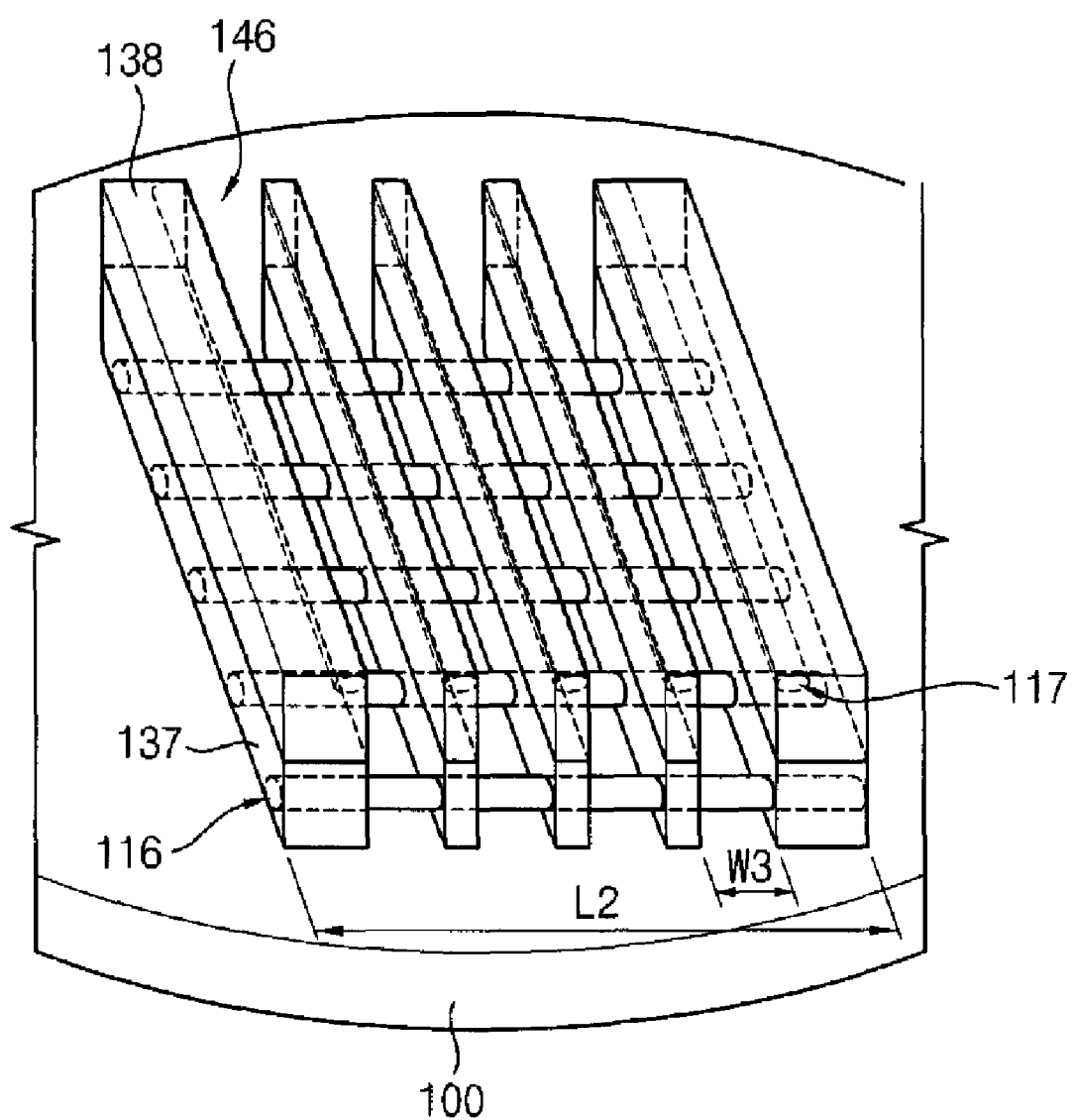

Referring to FIG. 21, the first and second insulation layer patterns 137 and 138 are partially removed by an etching process using the second nanowire structures 117 as an etching mask. Thus, a plurality of second openings 146, each of which extends in the third direction and has a third width W3 in the second direction, is formed to partially expose the first nanowire structures 116. The third width W3 may be substantially the same as the first distance D1. In exemplary embodiments, the second openings 146 may not expose end portions of each first nanowire structure 116 using a photoresist pattern (not shown) covering portions of the second insulation layer pattern 138 adjacent to the outermost second nanowire structure 117 in the etching process. Alternatively, the first and second insulation layer patterns 137 and 138 may be removed by a wet etching process.

Figure 22:
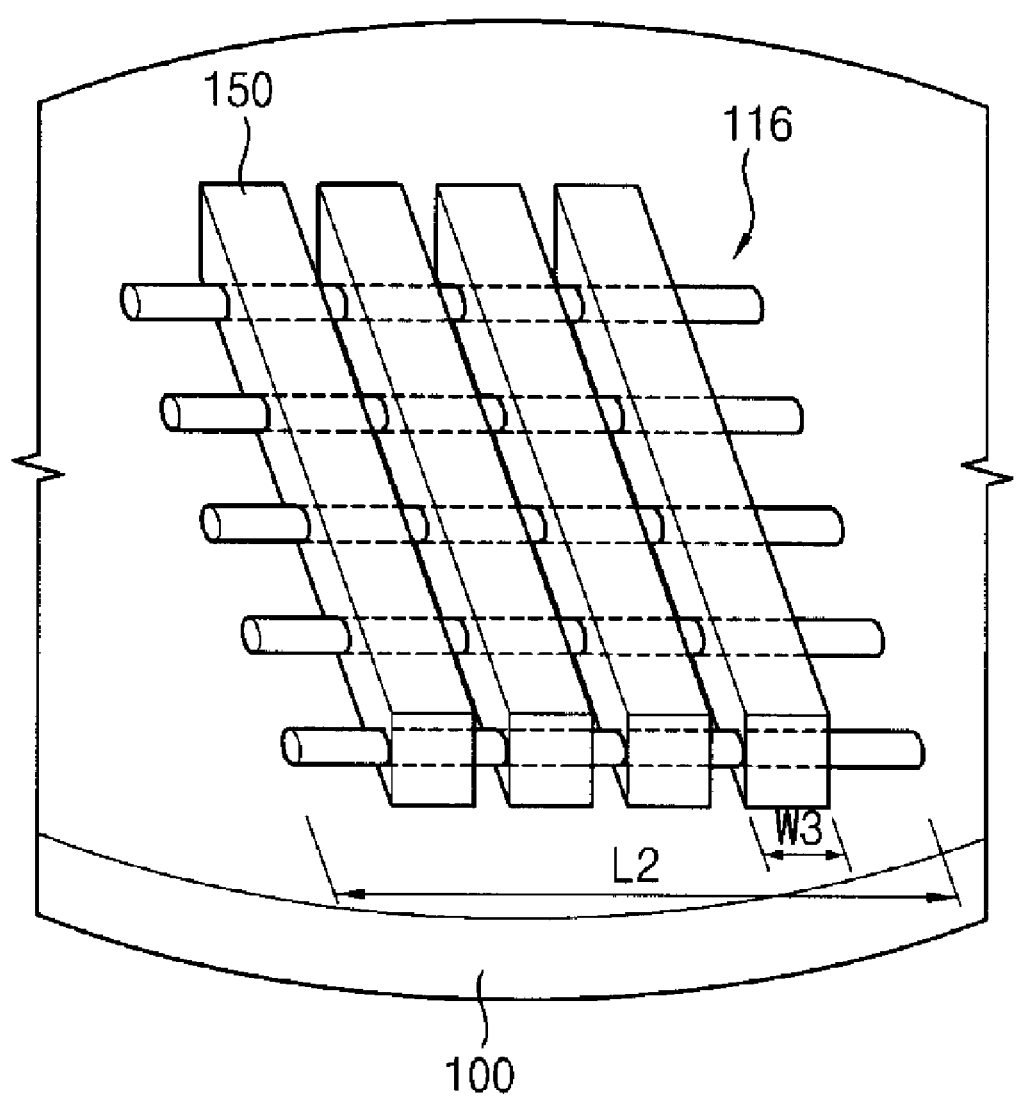

Referring to FIG. 22, a conductive layer is formed on the first substrate 100 to cover the second openings 146. The conductive layer may be formed using polysilicon, a metal or a metal silicide. An upper portion of the conductive layer may be planarized to form the gate lines 150. Thus, a plurality of gate lines 150, each of which extends in the third direction and fills the second openings 146, may be formed. The second nanowire structures 117 may be removed.

Referring to FIG. 23, the implantation process illustrated with reference to FIG. 16, and the processes for forming the CSL 175, the bit line plug 185 and the bit line 190 illustrated with reference to FIG. 17, are performed to manufacture a flash memory device.

A GAA type flash memory device in which the gate lines completely enclose portions of the nanowire structures may be manufactured by performing the process illustrated with reference to FIG. 18.

FIGS. 24, 25, and 27 to 30 are perspective views illustrating a method of manufacturing a semiconductor device in accordance with still other exemplary embodiments. Like numerals refer to like elements, and processes substantially the same as or similar to those illustrated with previous drawings are omitted here in order to avoid repetitive explanations, however, those skilled in the art can acknowledge that the omitted processes are also within the scope of the present invention.

Figure 24:
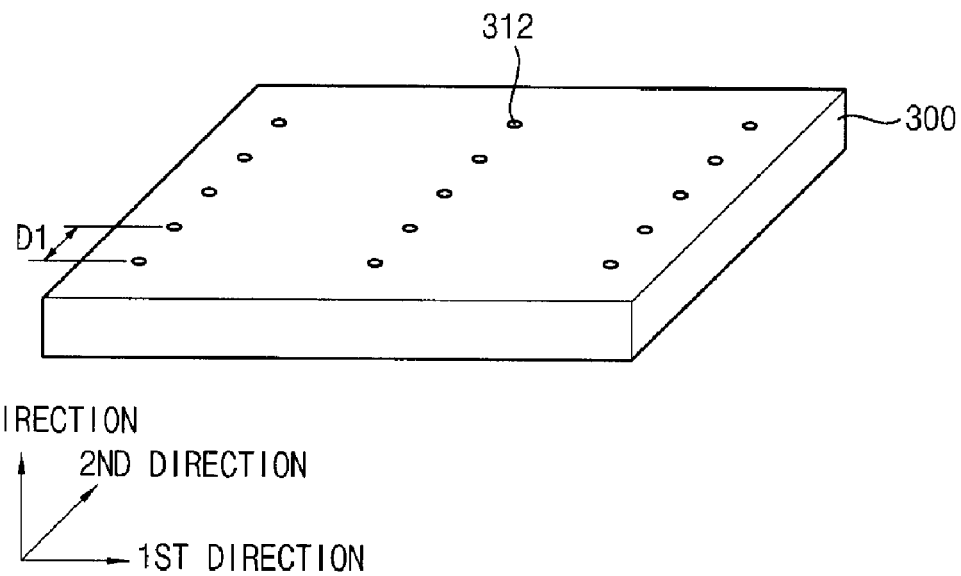

Referring to FIG. 24, a plurality of catalyst particles 312 is applied onto a fourth substrate 300.

The fourth substrate 300 may include a semiconductor material such as silicon, germanium, etc.

The catalyst particles 312 may be applied on the fourth substrate 300 at a first distance D1 therebetween in a second direction parallel to the fourth substrate 300, and may form a catalyst particle column. In exemplary embodiments, a plurality of catalyst particle columns is formed on the fourth substrate 300 in a first direction substantially perpendicular to the second direction to form a catalyst particle array.

Figure 25:
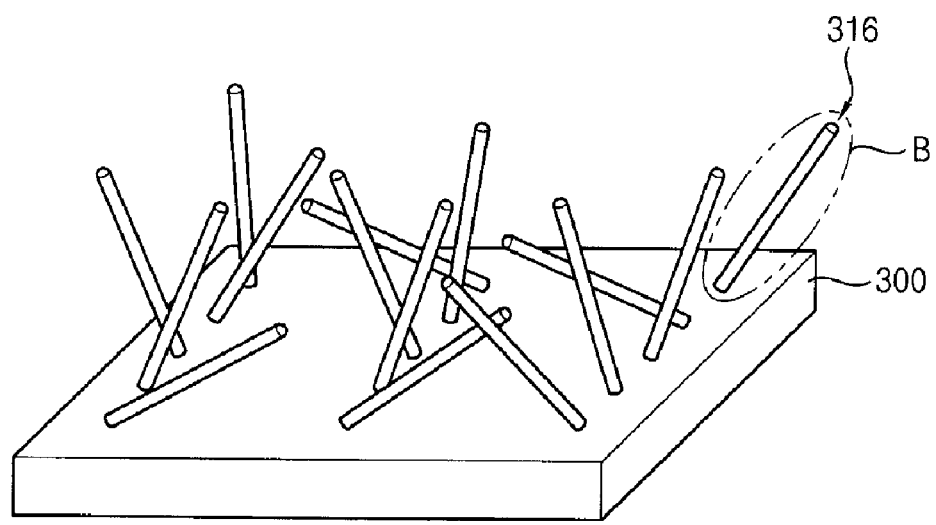
Figure 26:
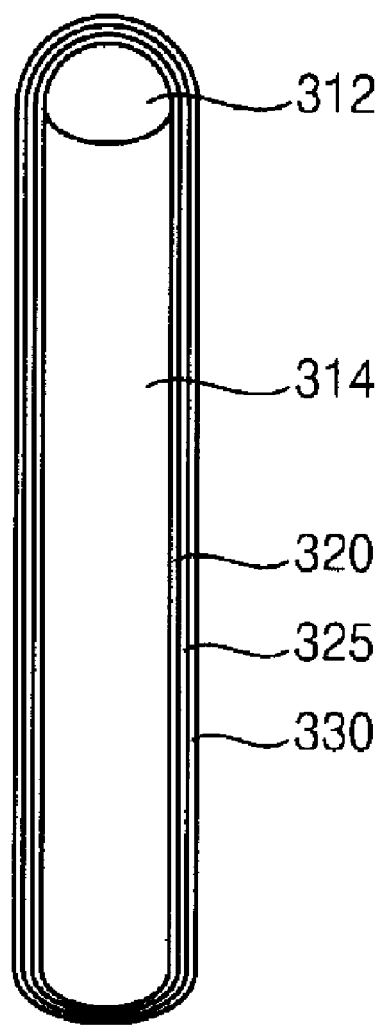

FIG. 26 is an enlarged perspective view of an area B in FIG. 25.

Referring to FIGS. 25 and 26, nanowires 314 are grown at positions of the catalyst particles 312 by a CVD process using a nanowire source gas. The catalyst particles 312 may remain on the nanowires 314. The nanowires 314 may grow not only in a third direction substantially perpendicular to the fourth substrate 300, but also in a random direction not perpendicular to the fourth substrate 300. As the nanowires 314 grow, a nanowire column and a nanowire array, which correspond to the catalyst particle column and the catalyst particle array, respectively, may be formed on the fourth substrate 300.

A tunnel insulation layer 320, a charge storing layer 325 and a blocking layer 330 enclosing each nanowire 314 and each catalyst particle 312 are sequentially formed. Thus, a plurality of nanowire structures 316, each of which includes the nanowire 314, the catalyst particle 312, the tunnel insulation layer 320, the charge storing layer 325 and the blocking layer 330, is formed. Additionally, a nanowire structure column and a nanowire structure array, which correspond to the nanowire column and the nanowire array, respectively, may be formed.

In FIG. 25, the tunnel insulation layer 320, the charge storing layer 325 and the blocking layer 330 are not shown in order to avoid complicating the drawings, and in the same manner, other drawings do not show the above layers.

Figure 27:
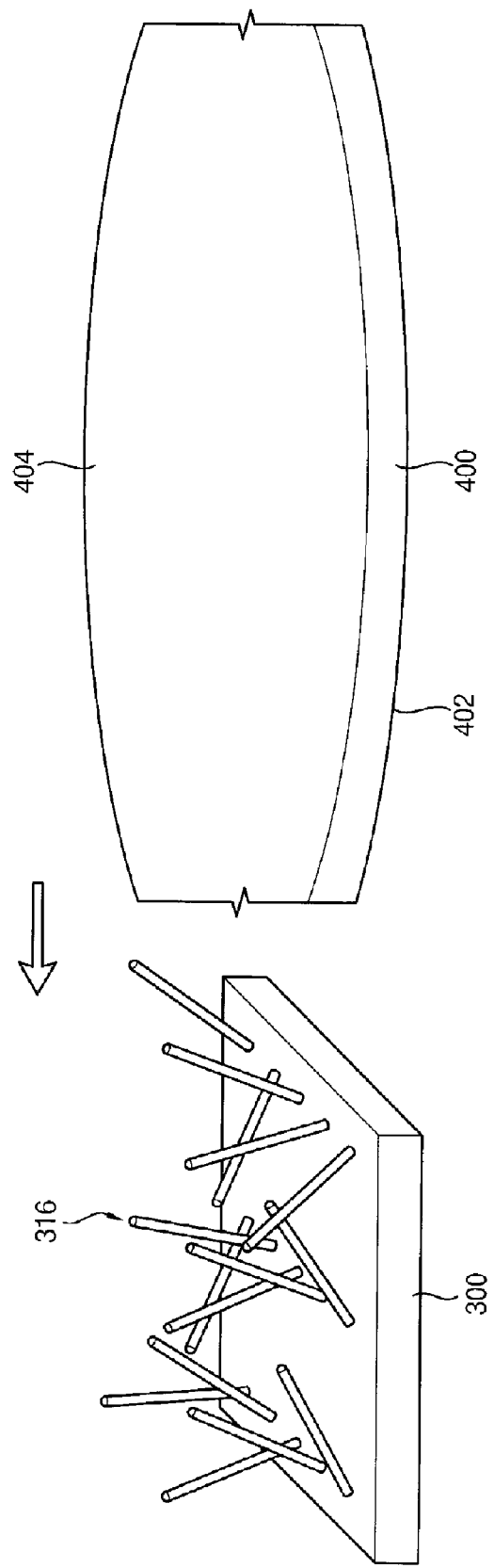
Figure 28:
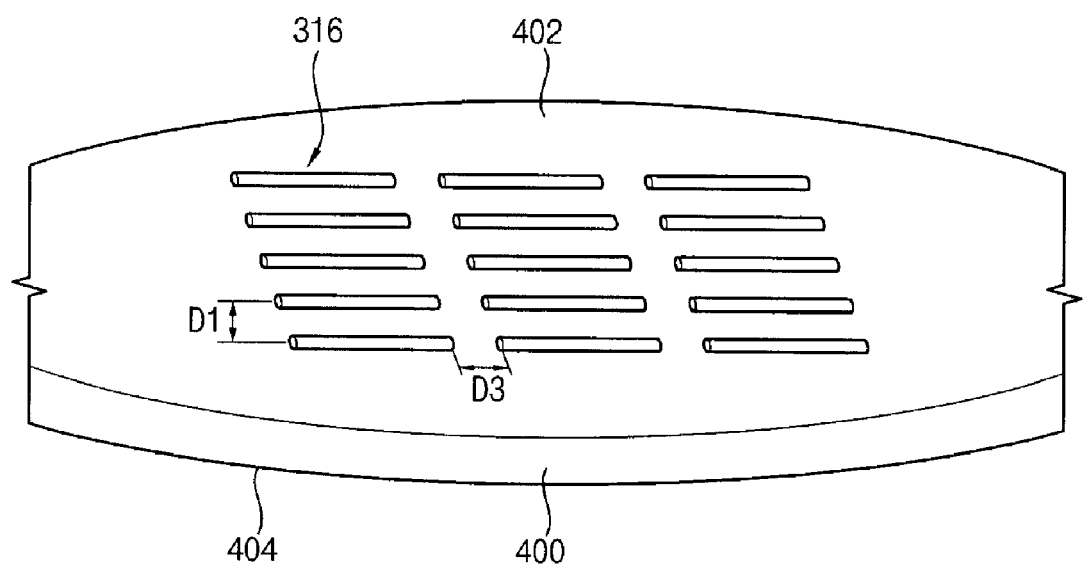

Referring to FIG. 27, a fifth substrate 400 is moved over the fourth substrate 300. The fifth substrate 400 may include an insulating material. For example, the fifth substrate 400 may include an oxide such as silicon oxide, a nitride such as silicon nitride, etc. The fifth substrate 400 has a first face 402 and a second face 404, and the fifth substrate 400 is moved over the fourth substrate 300, with the first face 402 facing the fourth substrate 300. FIG. 28 illustrates the fifth substrate 400 overturned. Hereinafter, the method of manufacturing the semiconductor device is illustrated with reference to FIG. 27 together with FIG. 28.

In exemplary embodiments, the fifth substrate 400 is moved along the first direction (or along a direction opposite to the first direction), and thus the nanowire structures 316 formed on the fourth substrate 300 may be attached to the first face 402 of the fifth substrate 400. Each of the nanowire structures 316 may be disposed on the first face 402 of the fifth substrate 400 in the first direction. Thus, a nanowire structure column including a plurality of nanowire structures 316, each of which is arranged in the first direction on the first face 402 of the fifth substrate 400, may be formed. Additionally, a nanowire structure array including a plurality of nanowire structure columns distant from each other at a third distance D3 may be formed. An insulating material having sufficient viscosity may be coated on the first face 402 so that the nanowire structures 316 may be better attached to the first face 402 of the fifth substrate 400. For example, the insulating material may include industrial oil.

As shown in FIG. 28, the fifth substrate 400 is turned over so that the first face 402 may face upward, in order to easily form a nanowire block on the fifth substrate 400.

Figure 29:
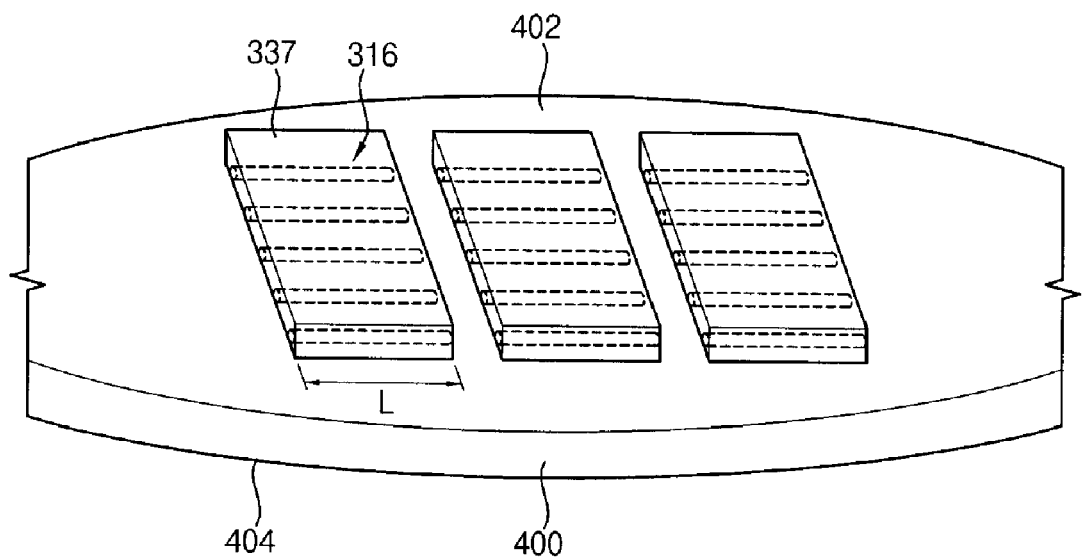

Referring to FIG. 29, a first insulation layer is formed on the fifth substrate 400 to cover the nanowire structures 316, and the first insulation layer is patterned to form a first insulation layer pattern 337. Thus, the nanowire block including the nanowire structures 316 and the first insulation layer pattern 337 may be formed. The nanowire block may include one nanowire structure column and the insulation layer pattern 337. The first insulation layer may be formed using an insulating material having an etching selectivity with respect to silicon oxide.

Both end portions of each nanowire block may be removed, so that the catalyst particles 312 of the nanowire structures 316 may be removed. Each nanowire block may have a length L in the first direction. The length L may correspond to integer times of a string length.

Gate lines 350 enclosing portions of the nanowire structures 316 may be formed by performing processes substantially the same as or similar to those shown in FIGS. 10 to 15.

Figure 30:
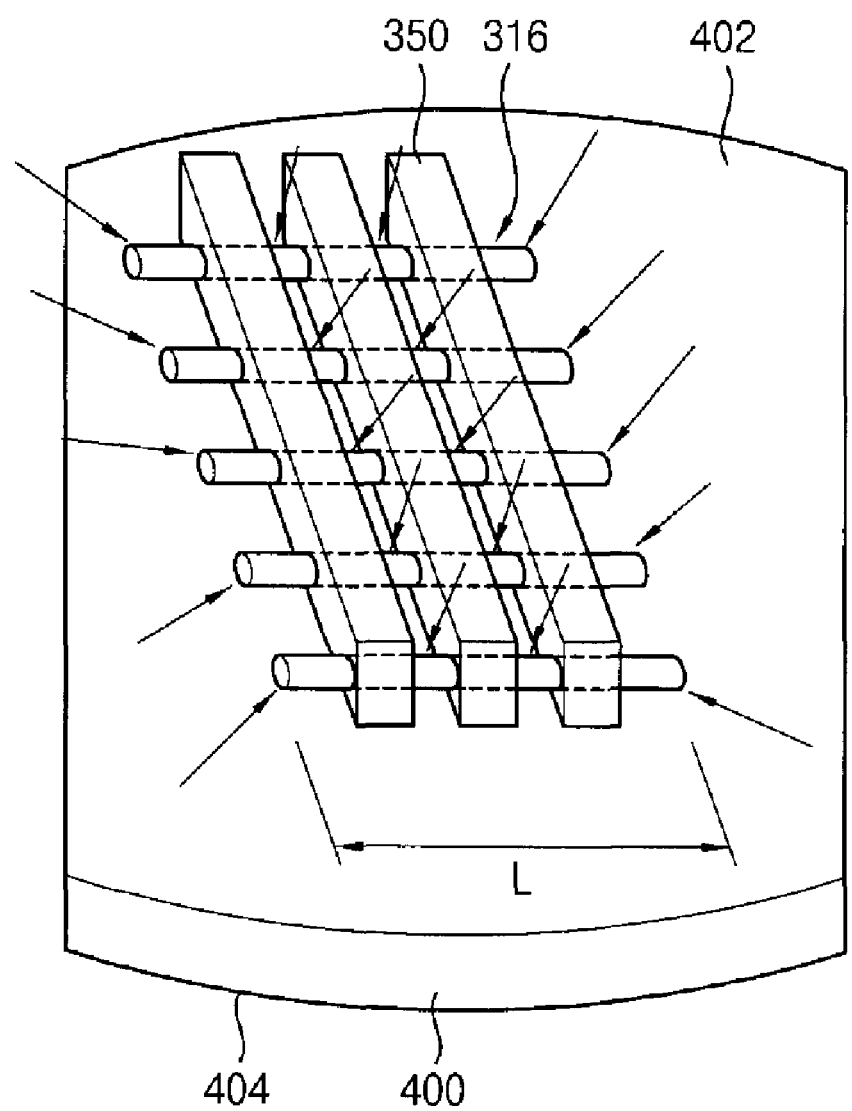

Referring to FIG. 30, impurities are implanted into portions of the nanowire structures 316 exposed by the gate lines 350 to define an impurity region and a channel region in each nanowire structure 316. As a result, a semiconductor device having a a-type gate line or a GAA type semiconductor device may be manufactured. A flash memory device including nanowire channels may be manufactured by performing the processes illustrated with reference to FIGS. 17 and 18.

FIGS. 31 to 36 are perspective views illustrating a method of manufacturing a semiconductor device in accordance with still other exemplary embodiments.

Figure 31:
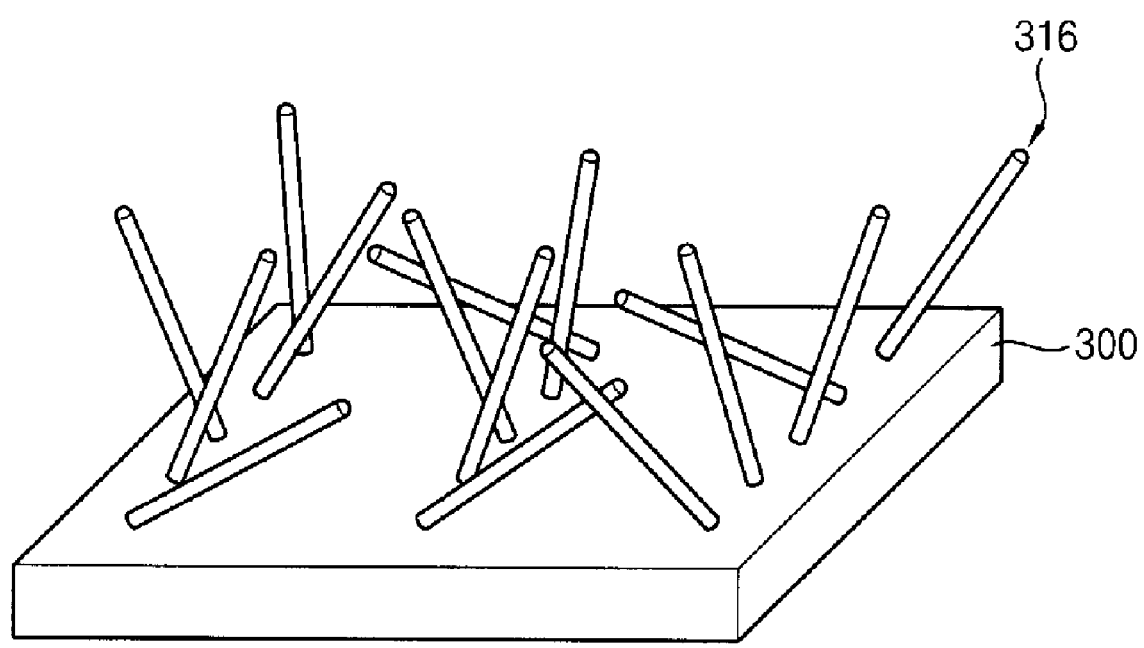

Referring to FIG. 31, a plurality of nanowire structures 316 is formed on the fourth substrate 300 by performing the processes illustrated with reference to FIGS. 24 to 26. Like numerals refer to like elements, and repetitive explanations are omitted here.

Figure 32:
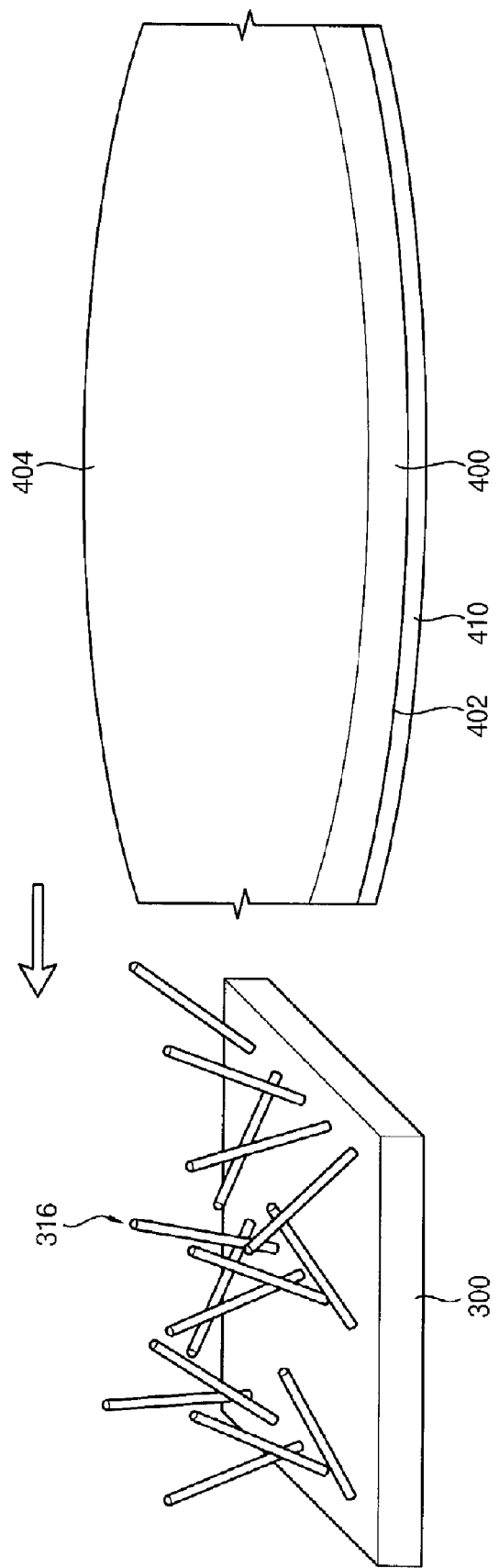
Figure 33:
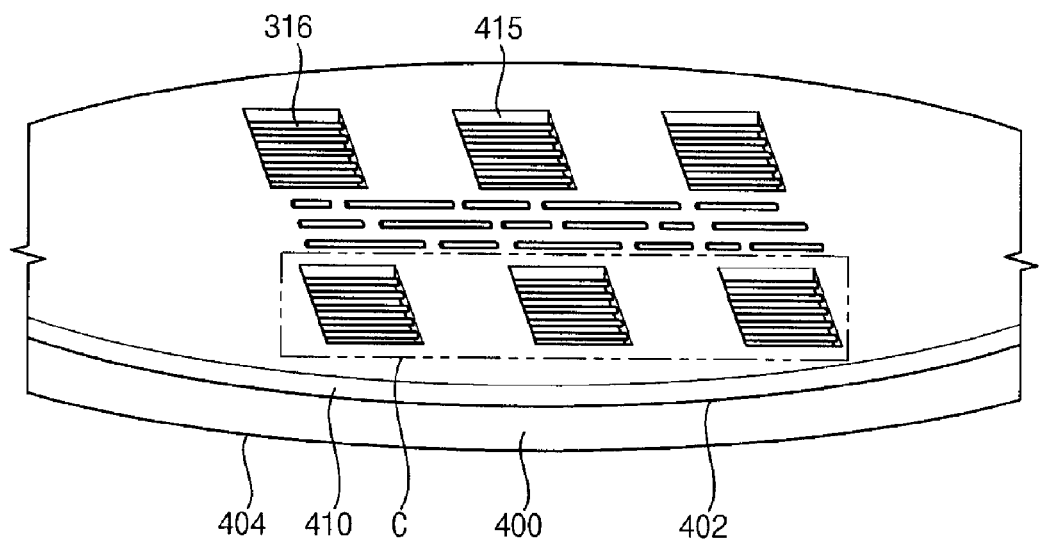

Referring to FIG. 32, the fifth substrate 400 is moved over the fourth substrate 300. The fifth substrate 400 has the first and second faces 402 and 404, and the fifth substrate 400 is moved over the fourth substrate 300 with the first face 402 facing the fourth substrate 300. A second insulation layer 410 having an opening 415 partially exposing the first face 402 is formed on the first face 402. The nanowire structures 316 will be arranged later in the opening on the first face 402. The second insulation layer 410 may be formed using an insulating material such as an oxide or a nitride. FIG. 33 illustrates the fifth substrate 400 overturned, and the method of manufacturing the semiconductor device is illustrated with reference to FIG. 32 together with FIG. 33.

In exemplary embodiments, the fifth substrate 400 is moved along the first direction (or along the direction opposite to the first direction), and thus the nanowire structures 316 formed on the fourth substrate 300 may be attached to the first space 402 of the fifth substrate 400. Each of the nanowire structures 316 may be attached onto a portion of the first face 402 of the fifth substrate 400 exposed by the opening 415 in the first direction. An insulating material having sufficient viscosity may be coated on the first face 402 so that the nanowire structures 316 may be better attached to the first face 402 of the fifth substrate 400. Some of the nanowire structures 316 may be attached onto the first insulation layer 410.

As a result, a nanowire structure column including a plurality of nanowire structures 316, each of which extends in the first direction, may be formed on the portion of the first face 402 exposed by the opening 415, and a nanowire structure array including a plurality of nanowire structure columns may be formed.

As shown in FIG. 33, the fifth substrate 400 is turned over so that the first face 402 may face upward, in order to easily form a nanowire block on the fifth substrate 400.

Figure 34:
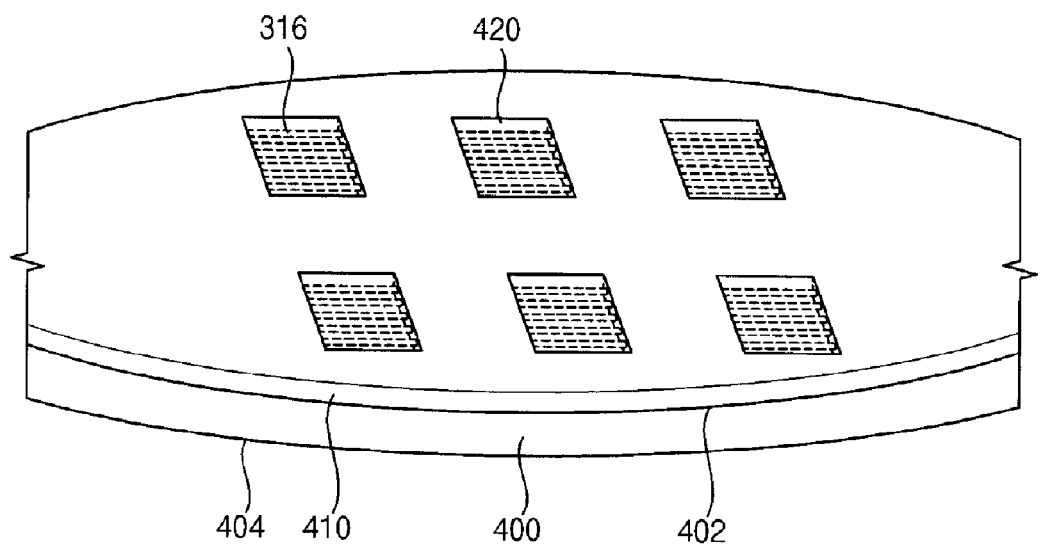

Referring to FIG. 34, a third insulation layer pattern 420 is formed to fill the opening 415. In particular, a third insulation layer is formed on the second insulation layer 410 using an insulating material to cover the opening 415. The third insulation layer may be formed using a material different from the second insulation layer 410. An upper portion of the third insulation layer may be planarized by a chemical mechanical polishing (CMP) process and/or an etch back process to form the third insulation layer pattern 420.

Figure 35:
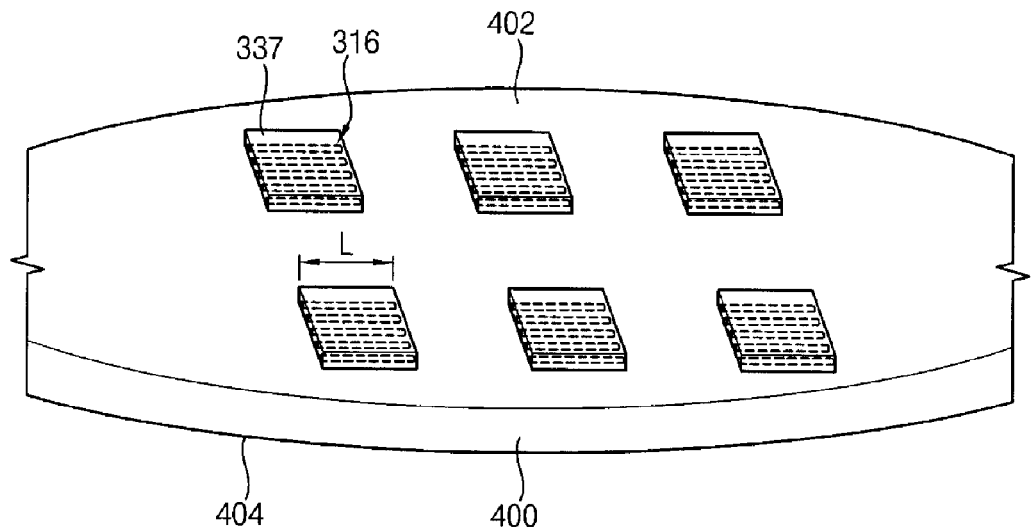

Referring to FIG. 35, the second insulation layer 410 is removed from the fifth substrate 400. Some of the nanowire structures 316 on the second insulation layer 410 may be also removed. In exemplary embodiments, the second insulation layer 410 is removed by a wet etching process. Thus, a nanowire block substantially the same as that of FIG. 29 may be formed.

Processes substantially the same as or similar to those illustrated with reference to FIGS. 10 to 15 are performed to form a plurality of gate lines 350 enclosing portions of the nanowire structures 316.

Figure 36:
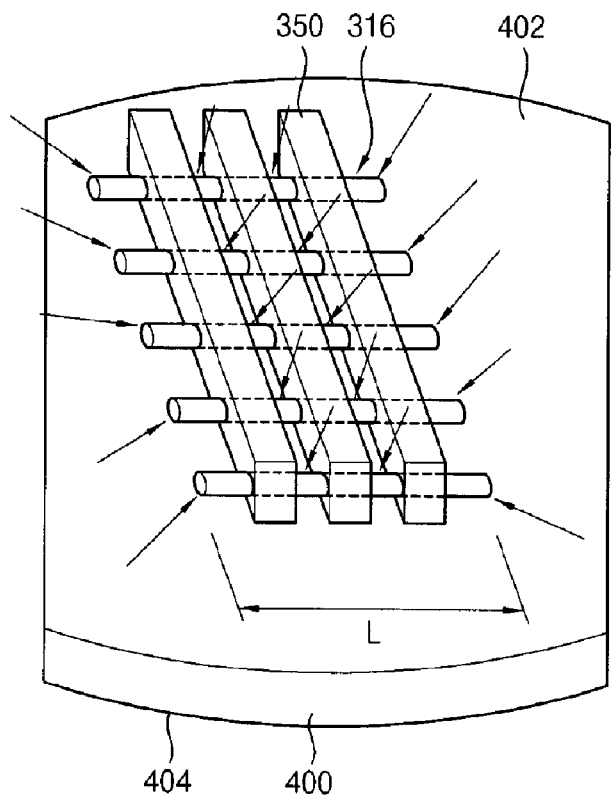

Referring to FIG. 36, impurities are implanted into portions of the nanowire structures 316 exposed by the gate lines 350 like the same manner shown in FIG. 30, thereby defining an impurity region and a channel region. Thus, a semiconductor device having a Ω-type gate line or a GAA type semiconductor device may be manufactured. A flash memory device may be manufactured by further performing the processes illustrated with reference to FIGS. 17 and 18.

According to some exemplary embodiments, a semiconductor device including a nanowire channel having a minute size may be easily manufactured. For example, a nanowire channel having a minute size and being well-arranged may be formed by a hybrid method including a top-down method and a bottom-up method, so that a highly integrated semiconductor device may be manufactured.

The foregoing is illustrative of exemplary embodiments and is not to be construed as limiting. Although a few exemplary embodiments have been described, those skilled in the art will readily appreciate that many modifications are possible without materially departing from the novel teachings and advantages of the present invention. Accordingly, all such modifications are intended to be included within the scope of the present invention as defined in the claims. In the claims, any means-plus-function clauses are intended to cover the structures described herein as performing the recited function and not only structural equivalents but also equivalent structures. Therefore, it is to be understood that the foregoing is illustrative of various exemplary embodiments and that scope of the invention is not to be construed as limited to the specific exemplary embodiments disclosed. Modifications to the disclosed exemplary embodiments, as well as other exemplary embodiments, are intended to be included within the scope of the appended claims.

What is claimed is:

1. A method of manufacturing a semiconductor device, the method comprising:
    growing a plurality of first nanowires on a first substrate in a first direction perpendicular to the first substrate;
    forming a first insulation layer covering the plurality of first nanowires to define a first nanowire block including the plurality of first nanowires and the first insulation layer;
    moving the first nanowire block so that each of the plurality of first nanowires is arranged in a second direction parallel to the first substrate;
    disposing a second nanowire block including second nanowires and a second insulation layer on the first nanowire block, each of the second nanowires extending in a third direction parallel to the first substrate;
    removing the first and second insulation layers using the second nanowires as an etching mask;
    forming a gate line covering portions of the plurality of first nanowires exposed by the second nanowires; and
    implanting impurities into portions of the plurality of first nanowires adjacent to the gate line.

2. The method of claim 1, wherein removing the first and second insulation layers comprises performing a dry etching process using the second nanowires as the etching mask.

3. The method of claim 1, further comprising, prior to implanting impurities onto the portions of the plurality of first nanowires, removing the second nanowires.

4. The method of claim 1, wherein moving the first nanowire block comprises moving the first nanowire block onto a second substrate, each of the plurality of first nanowires extending in a fourth direction parallel to the second substrate.

* * * * *